US 12,385,796 B2

(12) United States Patent
Yoshida

(10) Patent No.: US 12,385,796 B2
(45) Date of Patent: Aug. 12, 2025

(54) SEMICONDUCTOR DEVICE AND ELECTRONIC APPARATUS WITH O-RING REINFORCEMENT STRUCTURE

(71) Applicant: Murata Manufacturing Co., Ltd., Nagaokakyo (JP)

(72) Inventor: Yoshihiro Yoshida, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 258 days.

(21) Appl. No.: 18/136,952

(22) Filed: Apr. 20, 2023

(65) Prior Publication Data

US 2023/0296463 A1    Sep. 21, 2023

Related U.S. Application Data

(63) Continuation of application No. PCT/JP2021/033359, filed on Sep. 10, 2021.

(30) Foreign Application Priority Data

Nov. 16, 2020   (JP) ................................ 2020-190317

(51) Int. Cl.
*G01L 9/00* (2006.01)
*G01L 19/00* (2006.01)
(52) U.S. Cl.
CPC ........ *G01L 19/0038* (2013.01); *G01L 9/0041* (2013.01)
(58) Field of Classification Search
CPC . G01L 19/147; G01L 9/0072; G01L 19/0645; G01L 19/0084; G01L 13/025;
(Continued)

(56) References Cited

U.S. PATENT DOCUMENTS 6,393,922 B1    5/2002 Winterer
9,369,788 B1    6/2016 Ho et al.
(Continued)

FOREIGN PATENT DOCUMENTS

JP    2005043367 A    2/2005
JP    3212911 U    10/2017
(Continued)

OTHER PUBLICATIONS

International Search Report in PCT/JP2021/033359, mailed Nov. 16, 2021, 3 pages.
(Continued)

*Primary Examiner* — Andre J Allen
(74) *Attorney, Agent, or Firm* — Keating & Bennett, LLP

(57) ABSTRACT

A semiconductor device includes a detector mounted on a base substrate and including a pressure detector to detect pressure, a base portion on the base substrate where the detector is buried, a protruding portion protruding upward from the base portion and including an exposure hole which causes the pressure detector to be exposed upward, and a lid supported by an upper surface of the protruding portion to close the exposure hole. An outer circumferential portion of the lid extends outward from the protruding portion in plan view. The lid includes a slit that is open to an outer side surface and causes the exposure hole to communicate with outside sideward of the semiconductor device.

20 Claims, 17 Drawing Sheets

(58) Field of Classification Search
CPC ............ G01L 19/0007; G01L 19/0038; G01L 9/0042; G01L 9/0073; G01L 9/0075; G01L 9/0054; G01L 9/0055; G01L 19/04; G01L 7/00; G01L 7/04; G01L 19/148; G01L 19/14; G01L 19/143; G01L 17/00; G01L 7/18; G01L 19/0092; G01L 15/00; G01L 9/0051; G01L 7/041; G01L 9/12; G01L 9/065; G01L 19/0618; G01L 9/0052; G01L 9/125; G01L 7/16; G01L 19/0609; G01L 19/003; G01L 9/007; G01L 19/0627; G01L 19/0046; G01L 9/0022; G01L 9/06; G01L 19/0636; G01L 7/084; G01L 13/02; G01L 19/0023; G01L 19/142; G01L 7/043; G01L 19/08; G01L 9/0002; G01L 19/02; G01L 9/008; G01L 19/141; G01L 9/006; G01L 11/02; G01L 19/0672; G01L 23/10; G01L 23/18; G01L 19/0681; G01L 9/0077; G01L 19/12; G01L 27/005; G01L 7/082; G01L 9/0044; G01L 19/0015; G01L 19/0069; G01L 7/063; G01L 9/0001; G01L 19/146; G01L 21/12; G01L 27/002; G01L 27/007; G01L 9/16; G01L 11/00; G01L 19/00; G01L 9/0026; G01L 9/0089; G01L 9/045; G01L 9/14; G01L 19/0654; G01L 1/2281; G01L 11/025; G01L 13/026; G01L 11/008; G01L 7/22; G01L 13/00; G01L 9/0047; G01L 9/0076; G01L 7/08; G01L 9/0025; G01L 9/0035; G01L 9/0005; G01L 9/0041; G01L 19/0061; G01L 21/00; G01L 9/0019; G01L 9/08; G01L 9/10; G01L 11/006; G01L 9/04; G01L 19/086; G01L 9/0008; G01L 1/18; G01L 9/00; G01L 11/004; G01L 19/069; G01L 9/0057; G01L 19/083; G01L 19/10; G01L 19/16; G01L 19/06; G01L 9/0016; G01L 13/023; G01L 7/048; G01L 9/0048; G01L 9/0027; G01L 9/0086; G01L 9/0079; G01L 11/04; G01L 1/20; G01L 9/0091; G01L 27/00; G01L 11/002; G01L 23/24; G01L 7/182; G01L 1/02; G01L 19/0663; G01L 7/166; G01L 23/22; G01L 9/0036; G01L 9/0061; G01L 9/0039; G01L 23/125; G01L 19/145; G01L 9/0013; G01L 21/04; G01L 9/0045; G01L 9/0092; G01L 1/142; G01L 7/104; G01L 9/0033; G01L 9/0083; G01L 9/0098; G01L 1/2293; G01L 7/24; G01L 9/02; G01L 21/22; G01L 9/0029; G01L 7/022; G01L 1/205; G01L 9/0064; G01L 23/08; G01L 5/14; G01L 23/16; G01L 7/088; G01L 7/163; G01L 9/0007; G01L 13/06; G01L 23/222; G01L 1/16; G01L 1/2287; G01L 9/0085; G01L 9/025; G01L 1/2212; G01L 21/14; G01L 9/0004; G01L 23/02; G01L 9/003; G01L 9/085; G01L 1/14; G01L 1/148; G01L 9/0058; G01L 9/105; G01L 7/02; G01L 7/061; G01L 9/002; G01L 1/2231; G01L 13/028; G01L 9/0095; G01L 23/28; G01L 1/162; G01L 19/0076; G01L 7/12; G01L 9/0038; G01L 9/0032; G01L 21/10; G01L 7/024; G01L 19/149; G01L 1/246; G01L 7/086; G01L 1/005; G01L 5/228; G01L 7/06; G01L 1/2206; G01L 7/102; G01L 13/021; G01L 27/02; G01L 1/2262; G01L 1/24; G01L 1/26; G01L 23/00; G01L 9/0094; G01L 19/144; G01L 9/0082; G01L 1/125; G01L 9/0097; G01L 1/146; G01L 1/2268; G01L 11/06; G01L 21/30; G01L 21/34; G01L 23/221; G01L 7/187; G01L 7/20; G01L 23/26; G01L 7/068; G01L 1/144; G01L 1/225; G01L 23/32; G01L 7/14; G01L 1/165; G01L 23/12; G01L 1/241; G01L 13/04; G01L 7/045; G01L 1/086; G01L 1/22; G01L 7/108; G01L 9/18; G01L 1/127; G01L 17/005; G01L 5/18; G01L 1/245; G01L 21/32; G01L 1/183; G01L 1/2218; G01L 9/0023; G01L 1/243; G01L 23/145; G01L 5/0047; G01L 5/0076; G01L 9/0088; G01L 1/106; G01L 1/10; G01L 9/001; G01L 1/186; G01L 23/223; G01L 25/00; G01L 5/165; G01L 5/226; G01L 9/0017; G01L 1/044; G01L 3/245; G01L 9/005; G01L 1/08; G01L 21/16; G01L 3/1485; G01L 5/0038; G01L 5/162; G01L 5/225; G01L 7/026; G01L 7/065; G01L 9/0014; G01L 1/04; G01L 1/242; G01L 21/24; G01L 3/10; G01L 5/0004; G01L 5/0052; G01L 7/10; G01L 1/00; G01L 1/103; G01L 1/2275; G01L 1/247; G01L 21/02; G01L 21/26; G01L 23/225; G01L 3/102; G01L 3/105; G01L 5/223; G01L 5/24; G01L 7/028; G01L 9/0011; G01L 5/00; G01L 5/0028; G01L 5/243; G01L 1/083; G01L 1/12; G01L 21/36; G01L 23/04; G01L 23/14; G01L 23/30; G01L 3/103; G01L 5/0033; G01L 5/102; G01L 5/133; G01L 5/1627; G01L 5/166; G01L 7/185; G01L 1/255; G01L 21/08; G01L 5/0057; G01L 5/22; G01L 1/042; G01L 1/122; G01L 1/2225; G01L 1/2243; G01L 1/2256; G01L 1/248; G01L 2009/0067; G01L 2009/0069; G01L 21/06; G01L 23/06; G01L 3/00; G01L 3/06; G01L 3/1478; G01L 3/1492; G01L 3/18; G01L 3/24; G01L 3/242; G01L 5/0061; G01L 5/08; G01L 5/10; G01L 5/101; G01L 5/108; G01L 5/16; G01L 5/161; G01L 5/167; G01L 5/28; G01L 1/046; G01L 2009/0066; G01L 2019/0053; G01L 23/085; G01L 23/20; G01L 5/0071; G01L 5/008; G01L 5/06; G01L 5/171; G01L 7/106; H01L 2924/00014; H01L 2224/48091; H01L 2924/00; H01L 2224/73265; H01L 2224/48247; H01L 2224/48137; H01L 2924/00012; H01L 2924/181; H01L 2224/45144; H01L 2924/10253; H01L 2224/48227; H01L 2224/8592; H01L 2224/49171; H01L 2924/0002; H01L 2224/48465; H01L 2924/1815; H01L 2924/3025; H01L 2924/1461; H01L 2224/32225; H01L 2924/15151; H01L 2924/01079; H01L 2224/48472; H01L 24/48; H01L 2224/05554; H01L 24/45; H01L 2924/14; H01L 2224/45124; H01L 2924/16152; H01L 21/67253; H01L 2924/01013; H01L 2224/49175; H01L 2924/01006;

H01L 2924/16151; H01L 2924/01033; H01L 2924/01078; H01L 2924/01082; H01L 2924/01322; H01L 2224/32245; H01L 2924/10155; H01L 2224/16225; H01L 2924/01005; H01L 2924/13091; H01L 2224/45099; H01L 24/32; H01L 2924/014; H01L 2924/16195; H01L 2224/48464; H01L 24/49; H01L 2924/1305; H01L 2924/3011; H01L 2224/05553; H01L 23/057; H01L 2924/15153; H01L 2924/19107; H01L 2224/05644; H01L 2924/01014; H01L 2924/01047; H01L 2924/09701; H01L 24/05; H01L 24/73; H01L 2924/01046; H01L 2924/10158; H01L 2924/1433; H01L 2924/15311; H01L 2924/01023; H01L 2924/01029; H01L 2924/01074; H01L 2924/15165; H01L 2924/19105; H01L 21/00; H01L 2224/02166; H01L 2224/04042; H01L 2224/05599; H01L 2224/73257; H01L 23/24; H01L 23/49575; H01L 24/24; H01L 24/80; H01L 24/82; H01L 25/16; H01L 2924/30105; H01L 2924/351; H01L 21/2007; H01L 21/6835; H01L 2224/04105; H01L 2224/05568; H01L 2224/05573; H01L 2224/16227; H01L 2224/24137; H01L 2224/48699; H01L 2224/48744; H01L 2224/73204; H01L 24/19; H01L 2924/01024; H01L 2924/01027; H01L 2924/12042; H01L 2924/15156; H01L 2924/15747; H01L 2924/15787; H01L 2924/19042; H01L 21/568; H01L 22/12; H01L 2224/05001; H01L 2224/45015; H01L 2224/81801; H01L 2224/8385; H01L 23/5389; H01L 24/83; H01L 2924/01004; H01L 2924/07811; H01L 2924/207; H01L 21/30608; H01L 21/3065; H01L 21/31111; H01L 21/76897; H01L 22/34; H01L 2224/05124; H01L 2224/16235; H01L 2224/16245; H01L 2224/32145; H01L 2224/45147; H01L 2224/45169; H01L 2224/48644; H01L 2224/81805; H01L 2224/83805; H01L 23/16; H01L 23/291; H01L 23/3121; H01L 23/49503; H01L 24/06; H01L 24/85; H01L 25/0652; H01L 2924/01015; H01L 2924/01028; H01L 2924/01039; H01L 2924/0105; H01L 2924/01057; H01L 2924/01058; H01L 2924/0106; H01L 2924/01068; H01L 2924/01072; H01L 2924/01073; H01L 2924/12032; H01L 2924/12044; H01L 2924/15192; H01L 2924/19041; H01L 21/67132; H01L 2224/05624; H01L 2224/05647; H01L 2224/08245; H01L 2224/12105; H01L 2224/13; H01L 2224/2612; H01L 2224/26175; H01L 2224/48145; H01L 2224/48147; H01L 2224/48195; H01L 2224/80805; H01L 2224/80893; H01L 2224/80894; H01L 2224/83385; H01L 2224/8389; H01L 2224/92247; H01L 23/04; H01L 23/053; H01L 23/49811; H01L 23/49877; H01L 23/66; H01L 24/03; H01L 24/08; H01L 24/18; H01L 24/96; H01L 25/167; H01L 2924/00015; H01L 2924/01012; H01L 2924/01067; H01L 2924/01077; H01L 2924/16235; H01L 2924/18162; H01L 21/02126; H01L 21/02203; H01L 21/02216; H01L 21/02274; H01L 21/0273; H01L 21/0334; H01L 21/3105; H01L 21/311; H01L 21/32053; H01L 21/324; H01L 21/4842; H01L 21/561; H01L 21/67017; H01L 21/67069; H01L 21/67201; H01L 21/67276; H01L 21/6838; H01L 21/76; H01L 21/76297; H01L 21/764; H01L 21/7682; H01L 21/78; H01L 22/10; H01L 22/32; H01L 2221/00; H01L 2221/68359; H01L 2221/68363; H01L 2224/023; H01L 2224/02379; H01L 2224/05073; H01L 2224/05155; H01L 2224/05166; H01L 2224/05558; H01L 2224/0558; H01L 2224/056; H01L 2224/05669; H01L 2224/16145; H01L 2224/24011; H01L 2224/24051; H01L 2224/24226; H01L 2224/24227; H01L 2224/24998; H01L 2224/2518; H01L 2224/29099; H01L 2224/45014; H01L 2224/451; H01L 2224/4813; H01L 2224/48225; H01L 2224/48257; H01L 2224/48455; H01L 2224/48463; H01L 2224/48475; H01L 2224/48599; H01L 2224/48624; H01L 2224/48647; H01L 2224/48724; H01L 2224/48747; H01L 2224/48799; H01L 2224/48844; H01L 2224/49; H01L 2224/49052; H01L 2224/49109; H01L 2224/49113; H01L 2224/49173; H01L 2224/72; H01L 2224/73267; H01L 2224/76155; H01L 2224/78313; H01L 2224/78318; H01L 2224/82007; H01L 2224/82102; H01L 2224/82103; H01L 2224/8319; H01L 2224/85051; H01L 2224/85148; H01L 2224/85203; H01L 2224/85206; H01L 2224/85444; H01L 2224/85909; H01L 23/051; H01L 23/08; H01L 23/10; H01L 23/15; H01L 23/29; H01L 23/293; H01L 23/315; H01L 23/467; H01L 23/4821; H01L 23/4951; H01L 23/49513; H01L 23/49541; H01L 23/49548; H01L 23/49805; H01L 23/562; H01L 23/576; H01L 24/10; H01L 24/26; H01L 24/76; H01L 24/78; H01L 24/81; H01L 25/03; H01L 25/041; H01L 25/50; H01L 2924/0001; H01L 2924/00013; H01L 2924/01007; H01L 2924/0101; H01L 2924/01019; H01L 2924/01026; H01L 2924/01038; H01L 2924/0104; H01L 2924/01041; H01L 2924/01042; H01L 2924/01051; H01L 2924/01076; H01L 2924/0133; H01L 2924/04642; H01L 2924/04941; H01L 2924/05042; H01L 2924/07802; H01L 2924/10161; H01L 2924/12036; H01L 2924/1301; H01L 2924/13062; H01L 2924/15174; H01L 2924/1531; H01L 2924/15788; H01L 2924/163; H01L 2924/19043; H01L 2924/206; H01L 2924/30107; H01L 21/02107; H01L 21/02282; H01L 21/314; H01L 21/56; H01L 21/67; H01L 21/67051; H01L 22/00; H01L 2224/0603; H01L 2224/131; H01L 2224/16; H01L 2224/18; H01L 2224/2919; H01L 2224/29191; H01L 2224/48106; H01L 2224/4847; H01L 2224/49105; H01L 2224/82951; H01L 2224/85399; H01L 2225/1023; H01L 2225/1058; H01L 23/047; H01L 23/3128; H01L 23/481; H01L 23/4952; H01L 23/49558; H01L

23/49861; H01L 23/5226; H01L 23/552;
H01L 23/564; H01L 23/62; H01L 24/09;
H01L 24/13; H01L 24/16; H01L 24/29;
H01L 25/105; H01L 25/165; H01L
2924/0665; H01L 2924/10329; H01L
2924/152; H01L 2924/15331; H01L
2924/1627
USPC .................................................. 73/700–756
See application file for complete search history.

(56) References Cited

U.S. PATENT DOCUMENTS

| | | | | |
|---|---|---|---|---|
| 9,448,130 | B2* | 9/2016 | Vaupel | H01L 23/3185 |
| 11,348,880 | B2* | 5/2022 | Yoshida | B81B 7/0061 |
| 12,178,135 | B2* | 12/2024 | Yoshida | H10N 30/88 |
| 2009/0266173 | A1* | 10/2009 | Kobayashi | G01L 9/0075 |
| | | | | 73/724 |
| 2019/0358859 | A1* | 11/2019 | Izumi | G01L 19/145 |
| 2020/0381371 | A1 | 12/2020 | Yoshida et al. | |
| 2023/0307303 | A1* | 9/2023 | Kishigui | H01L 23/053 |
| 2024/0167901 | A1* | 5/2024 | Ota | G01L 9/0072 |

FOREIGN PATENT DOCUMENTS

| | | |
|---|---|---|
| WO | 2012133065 A1 | 10/2012 |
| WO | 2019176527 A1 | 9/2019 |
| WO | 2019208127 A1 | 10/2019 |

OTHER PUBLICATIONS

Written Opinion in PCT/JP2021/033359, mailed Nov. 16, 2021, 5 pages.
Official Communication issued in correpsonding Chinese Patent Application No. 202180076431.4, mailed on Jul. 3, 2025, 9 pages.

* cited by examiner

SEMICONDUCTOR DEVICE AND ELECTRONIC APPARATUS WITH O-RING REINFORCEMENT STRUCTURE

CROSS REFERENCE TO RELATED APPLICATIONS

This application claims the benefit of priority to Japanese Patent Application No. 2020-190317 filed on Nov. 16, 2020 and is a Continuation Application of PCT Application No. PCT/JP2021/033359 filed on Sep. 10, 2021. The entire contents of each application are hereby incorporated herein by reference.

BACKGROUND OF THE INVENTION

1. Field of the Invention

The present invention relates to a waterproof semiconductor device and an electronic apparatus including the semiconductor device.

2. Description of the Related Art

International Publication No. 2019/208127 discloses a waterproof semiconductor device attached to an electronic apparatus such as a pressure measuring device to measure pressure. The semiconductor device includes a base substrate, a detecting element, and a resin package. The detecting element is to detect pressure, and is mounted on the base substrate. The detecting element is electrically connected via a connecting member such as a wire to the base substrate and a circuit element mounted on the base substrate. The resin package is provided to the base substrate. The detecting element and the connecting member are buried in the resin package. The resin package includes an exposure hole for causing a detecting unit of the detecting element to be exposed outside. Via the exposure hole, pressure acts on the detecting unit of the detecting element.

The semiconductor device disclosed in International Publication No. 2019/208127 includes a cylindrical member having a through hole which communicates with the exposure hole. The cylindrical member penetrates through an O ring. With this, the O ring fits in around the cylindrical member. In a state in which the semiconductor device is attached to the electronic apparatus, a gap between a casing of the electronic apparatus and the semiconductor device is sealed by the O ring. With this, the liquid is prevented from entering the inside of the electronic apparatus from outside via the gap.

SUMMARY OF THE INVENTION

When the semiconductor device disclosed in International Publication No. 2019/208127 is attached to the electronic apparatus, the O ring is first fitted in the semiconductor device. Next, the semiconductor device with the O ring fitted therein is attached to the electronic apparatus.

It is desired that fitting the O ring in the semiconductor device can be easily performed. Thus, for example, the O ring is formed so that the inner diameter of the O ring is equal to or larger than the outer diameter of the cylindrical member. This facilitates penetration of the cylindrical member to the O ring. As a result, the O ring can be easily fitted in the cylindrical member.

However, if penetration of the cylindrical member to the O ring is easy as described above, the O ring easily drops off from the cylindrical member. With this, when the semiconductor device with the O ring fitted therein is attached to the electronic apparatus, a possibility that the O ring drops off from the cylindrical member is increased. Thus, there is a fear that attaching the semiconductor device with the O ring fitted therein to the electronic apparatus is difficult.

Therefore, preferred embodiments of the present invention provide semiconductor devices each capable of preventing a fitted O ring from dropping off.

A semiconductor device according to one aspect of a preferred embodiment of the present invention is a semiconductor device which detects pressure, the semiconductor device including a base substrate, a detector mounted on an upper surface of the base substrate and including a pressure detector, a resin package provided on the upper surface of the base substrate, with the detector buried therein, and including an exposure hole which exposes the pressure detector, a lid supported by the resin package so as to close the exposure hole, and a communicating portion which causes the exposure hole to communicate with outside, in which the resin package includes a base portion where the detector is buried, and a protruding portion protruding upward from the base portion and including the exposure hole, in plan view, the base portion extends outward from an outer side surface of the protruding portion, the lid is supported by an upper surface of the protruding portion, the lid includes an extending portion in at least a portion of an outer circumferential portion of the lid, the extending portion extending outward from the outer side surface of the protruding portion in plan view, and the communicating portion is open sideward of the semiconductor device to communicate with outside.

According to preferred embodiments of the present invention, a fitted O ring can be prevented from dropping off.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
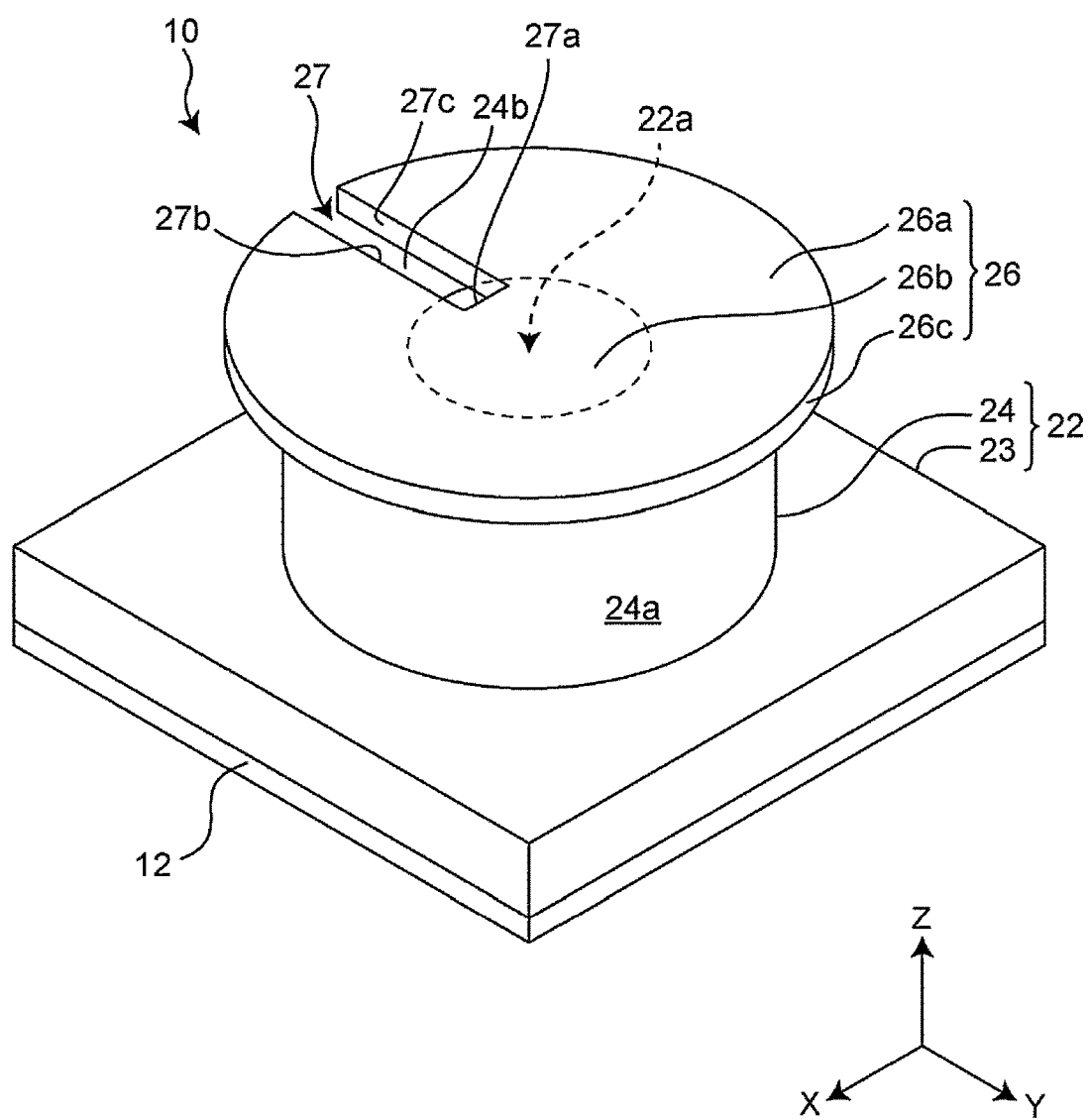
FIG. 1 is a perspective view of a semiconductor device according to Preferred Embodiment 1 of the present invention.

A semiconductor device according to one aspect of a preferred embodiment of the present invention is a semiconductor device which detects pressure, the semiconductor device including a base substrate, a detector mounted on an upper surface of the base substrate and including a pressure detector, a resin package provided on the upper surface of the base substrate, with the detector buried therein, and including an exposure hole which exposes the pressure detector, a lid supported by the resin package so as to close the exposure hole, and a communicating portion which causes the exposure hole to communicate with outside of the semiconductor device, in which the resin package includes a base portion where the detector is buried, and a protruding portion protruding upward from the base portion and including the exposure hole, in plan view, the base portion extends outward from an outer side surface of the protruding portion, the lid is supported by an upper surface of the protruding portion, the lid includes an extending portion in at least a portion of an outer circumferential portion of the lid, the extending portion extending outward from the outer side surface of the protruding portion in plan view, and the communicating portion is open sideward of the semiconductor device to communicate with outside.

According to this structure, the lid includes the extending portion. The extending portion extends outward from the outer side surface of the protruding portion. Thus, when the O ring is arranged so that its inner circumferential portion surrounds the protruding portion in plan view, the O ring can be restrained by the extending portion from coming off from above.

If the semiconductor device does not include the lid, there is a fear that a foreign matter falling from above may make contact with the pressure detector via the exposure hole to influence detection of pressure by the pressure detector. With this structure, since the exposure hole is covered with the lid, a foreign matter falling from above is prevented from entering the exposure hole.

To cause pressure from outside to act on the pressure detector while the exposure hole is closed with the lid, it is thought that a through hole penetrating through the lid in an up-down direction to cause the outside and the exposure hole to communicate with each other is provided. However, when a foreign matter falling from above closes the through hole, it is not possible to cause pressure from outside to act on the pressure detector. However, according to this structure, pressure from outside is caused to act on the pressure detecting from a side of the semiconductor device via the communicating portion and the exposure hole. Thus, a possibility that a foreign matter falling from above closes the communicating portion can be decreased.

The communicating portion may have a space defined by a slit located inward of the outer circumferential portion of the lid in plan view.

According to this structure, by providing only the slit in the lid, the function of the communicating portion can be achieved.

According to this structure, the lid is open by the slit not only sideward but also upward. Thus, the communicating portion can cause the exposure hole and the outside of the semiconductor device to communicate with each other not only sideward but also upward of the semiconductor device. Since this facilitates circulation of the fluid from outside to the exposure hole, responsiveness of the pressure detector which detects pressure of the fluid can be improved. Also, even if a portion above the slit is closed with a foreign matter, communication from a side of the semiconductor device to the exposure hole can be maintained.

The slit may be at a position outside of the pressure detector in plan view.

According to this structure, a possibility that a foreign matter falling from above makes contact with the pressure detector via the slit can be decreased.

The slit may include a wide portion at least a portion of which overlaps the exposure hole in plan view, and a narrow portion connected to the wide portion and not overlapping the exposure hole in plan view.

According to this structure, circulation of the fluid between above the lid and the exposure hole is facilitated by the wide portion. Thus, responsiveness of the pressure detector to detect pressure of the fluid can be improved.

According to this structure, the width of the slit is narrow at a portion not overlapping the exposure hole in plan view, that is, a portion where the lid and the upper surface of the protruding portion are in contact with each other. Thus, the contact area between the lid and the protruding portion can be increased. This stabilizes the lid.

The lid may include three or more of the slits.

According to this structure, when the lid is supported by the upper surface of the protruding portion, the outer side surface of the protruding portion is visually recognized at three or more locations via the respective three or more slits provided. With this, positioning of the lid with respect to the protruding portion can be accurately performed.

A semiconductor device according to one aspect of a preferred embodiment of the present invention may include an adhering portion interposed partially between the upper surface of the protruding portion and the lid to fix the lid to the protruding portion. The communicating portion may include a space between the upper surface of the protruding portion and the lid which are opposed to each other in a portion between the upper surface of the protruding portion and the lid where the adhering portion is not interposed.

According to this structure, when the lid is adhered to the protruding portion, by only providing an area where no adhesive is applied between the lid and the protruding portion, that area can be made function as the communicating portion.

The protruding portion may include a first concave portion recessed downward from the upper surface of the protruding portion. The communicating portion may include a space defined by the first concave portion.

According to this structure, only by providing the first concave portion in the protruding portion, the function of the communicating portion can be achieved.

The lid may include a second concave portion recessed upward from a lower surface of the lid. The communicating portion may include a space defined by the second concave portion.

According to this structure, only by providing the second concave portion in the lid, the function of the communicating portion can be achieved.

A semiconductor device according to one aspect of a preferred embodiment of the present invention may include at least two of a slit located inward from the outer circumferential portion of the lid in plan view, an adhering portion interposed partially between the upper surface of the protruding portion and the lid to fix the lid to the protruding portion, a first concave portion recessed downward from the upper surface of the protruding portion and a second concave portion recessed upward from a lower surface of the lid, in which when the semiconductor device includes the slit, the communicating portion may include a first space defined by the slit, when the semiconductor device includes the adhering portion, the communicating portion may include a second space between the upper surface of the protruding portion and the lid which are opposed to each other in a portion between the upper surface of the protruding portion and the lid where the adhering portion is not provided, when the semiconductor device includes the first concave portion, the communicating portion may include a third space defined by the first concave portion, when the semiconductor device includes the second concave portion, the communicating portion may include a fourth space defined by the second concave portion, and in plan view, the first space, the second space, the third space, and the fourth space may overlap one another.

According to this structure, the cross-sectional area of the communicating portion can be increased. Since this facilitates circulation of the fluid in the communicating portion, responsiveness of the pressure detector to detect pressure of the fluid can be improved.

A semiconductor device according to one aspect of a preferred embodiment of the present invention may include at least two of a slit located inward from the outer circumferential portion of the lid in plan view, an adhering portion interposed partially between the upper surface of the protruding portion and the lid to fix the lid to the protruding portion, a first concave portion recessed downward from the upper surface of the protruding portion, and a second concave portion recessed upward from a lower surface of the lid, in which when the semiconductor device includes the slit, the communicating portion may include a first space defined by the slit, when the semiconductor device includes the adhering portion, the communicating portion may include a second space between the upper surface of the protruding portion and the lid which are opposed to each other in a portion between the upper surface of the protruding portion and the lid where the adhering portion is not provided, when the semiconductor device includes the first concave portion, the communicating portion may include a third space defined by the first concave portion, when the semiconductor device includes the second concave portion, the communicating portion may include a fourth space defined by the second concave portion, and in plan view, the first space, the second space, the third space, and the fourth space do not have to overlap one another.

According to this structure, the number of paths through which the fluid circulates can be increased. Since this facilitates circulation of the fluid in the communicating portion, responsiveness of the pressure detector to detect pressure of the fluid can be improved.

A semiconductor device according to one aspect of a preferred embodiment of the present invention may include a circuit element mounted on the upper surface of the base substrate and a connector to electrically connect the circuit element and the detector together.

An electronic apparatus according to one aspect of a preferred embodiment of the present invention may include the above-described semiconductor, an O ring surrounding the protruding portion of the resin package of the semiconductor device in plan view and including an inner circumferential portion in contact with the outer side surface of the protruding portion, and a casing to which the semiconductor device is attached.

According to this structure, in the electronic apparatus including the semiconductor device, the O ring can be restrained by the extending portion from coming off from above.

Preferred Embodiment 1

Figure 2:
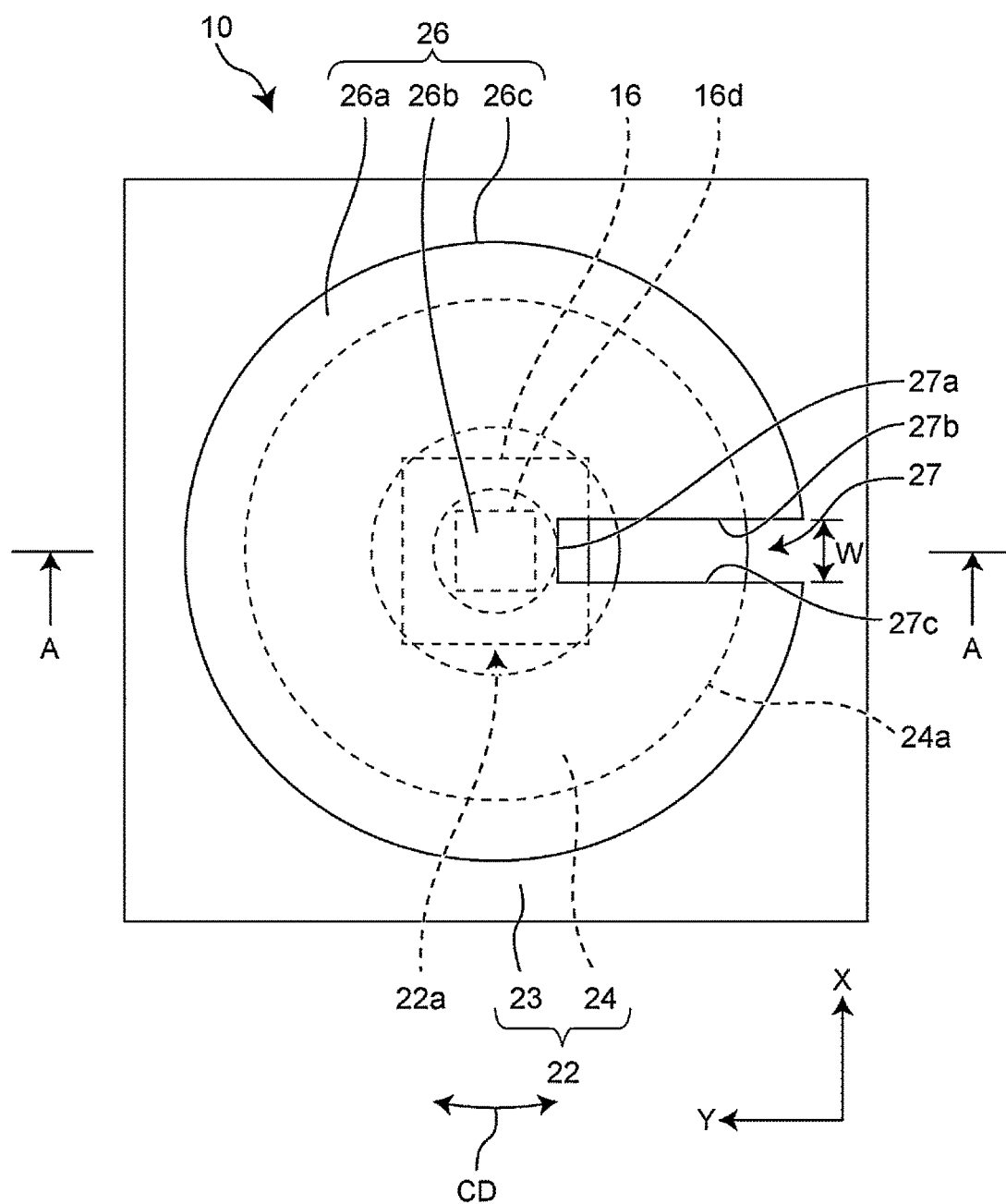
FIG. 2 is a plan view of the semiconductor device according to Preferred Embodiment 1 of the present invention.
Figure 3:
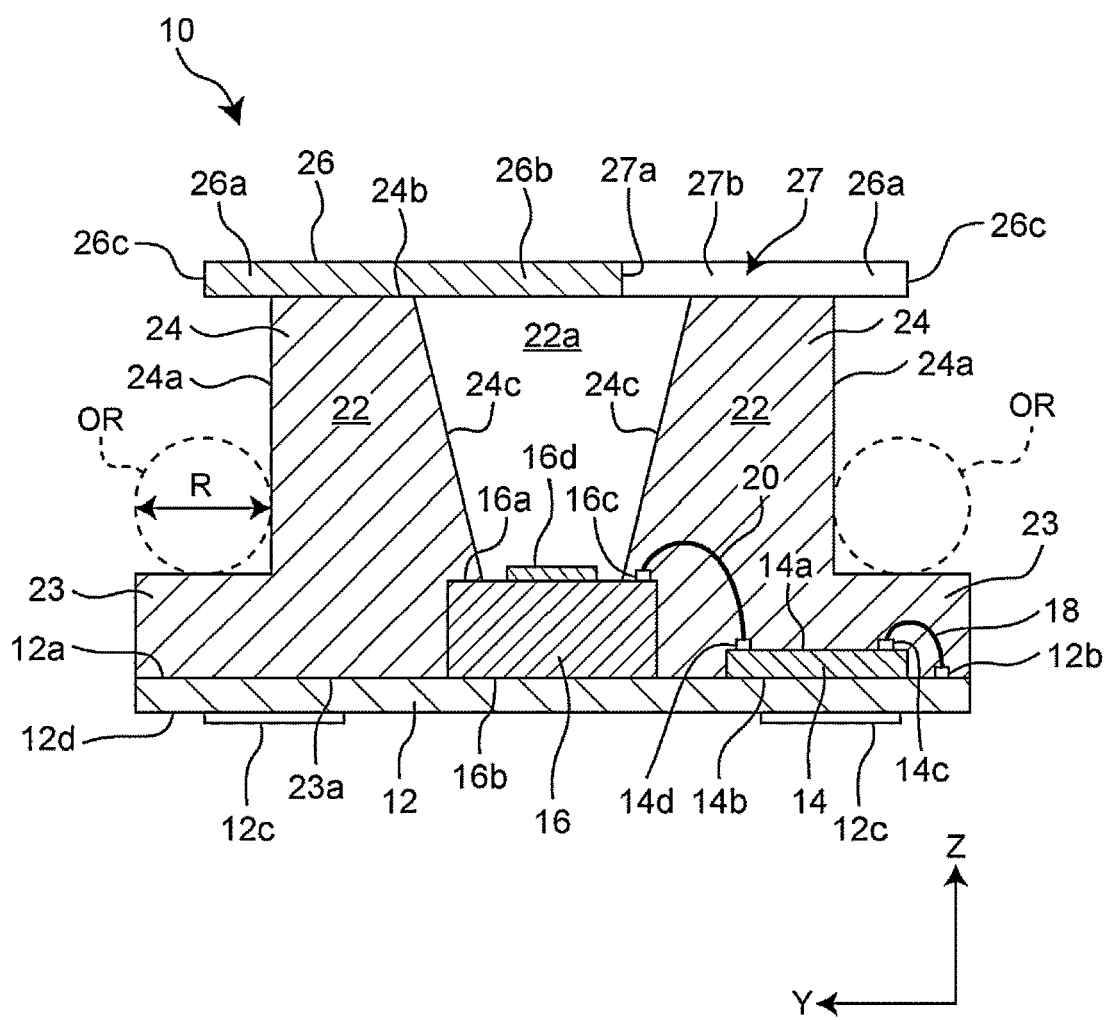
FIG. 3 is a sectional view along an A-A line of FIG. 2.
Figure 4:
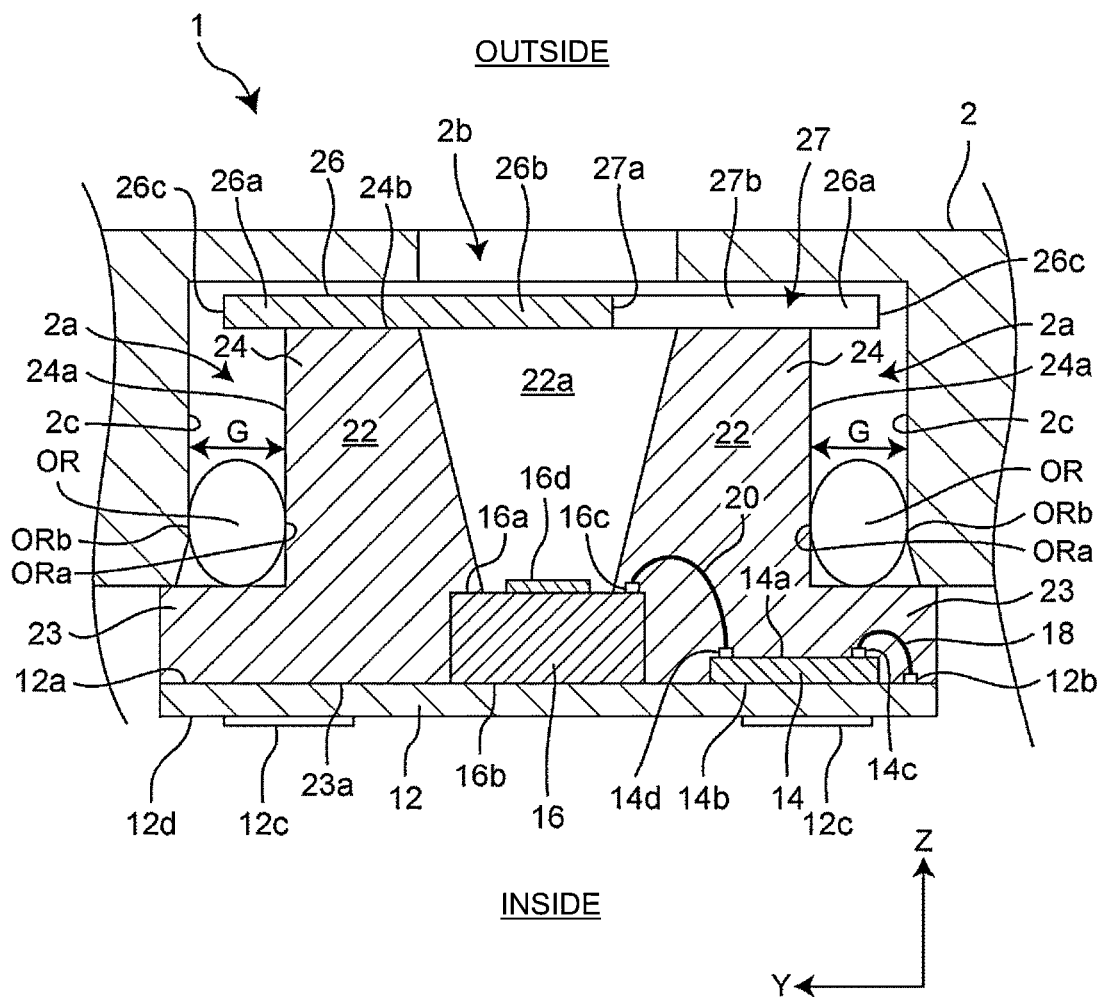
FIG. 4 is a sectional view of the semiconductor device of FIG. 3 in a state of being attached to an article of an electronic apparatus.

FIG. 1 is a perspective view of a semiconductor device 10 according to Preferred Embodiment 1 of the present invention. FIG. 2 is a plan view of the semiconductor device 10 according to Preferred Embodiment 1 of the present invention. FIG. 3 is a sectional view along an A-A line of FIG. 2. FIG. 4 is a sectional view of the semiconductor device 10 of FIG. 3 in a state of being attached to an article of an electronic apparatus 1. An X-Y-Z orthogonal coordinate system depicted in these drawings and the drawings described below are for ease of understanding of preferred embodiments of the present invention and do not limit the present invention.

A semiconductor device 10 is a pressure sensor which detects pressure. As depicted in FIG. 1 to FIG. 3, the semiconductor device 10 includes a base substrate 12, a circuit element 14 mounted on the base substrate 12, a detecting element 16 mounted on the base substrate 12, a resin package 22, and a lid member 26.

In Preferred Embodiment 1, the base substrate 12 is a rigid substrate such as a glass epoxy substrate or ceramic substrate, but is not limited to this. For example, the base substrate 12 may be a lead frame.

As depicted in FIG. 3, the circuit element 14 and the detecting element 16 are mounted on an upper surface 12a of the base substrate 12. The base substrate 12 includes a pad 12b on the upper surface 12a. While one pad 12b is depicted in FIG. 3, the number of pads 12b is not limited to one. The pad 12b is electrically connected via a bonding wire 18 to the circuit element 14. The base substrate 12 includes an external connection terminal 12c on a lower surface 12d, which is a back surface of the upper surface 12a. The semiconductor device 10 is electrically connected to another external device (not depicted) via the external connection terminal 12c.

The circuit element 14 includes an upper surface 14a and a lower surface 14b, which is a back surface of the upper surface 14a. In Preferred Embodiment 1, the circuit element 14 is an element including an application specific integrated circuit (ASIC). In Preferred Embodiment 1, the lower surface 14b of the circuit element 14 is adhered to the upper surface 12a of the base substrate 12 with a die attach film, a die attach material, or the like.

The circuit element 14 includes a first pad 14c on the upper surface 14a. While only one first pad 14c is depicted in FIG. 3, the number of first pads 14c is not limited to one. The first pad 14c is electrically connected via the bonding wire 18 to the pad 12b of the base substrate 12.

The circuit element 14 includes a second pad 14d on the upper surface 14a, separately from the first pad 14c. While one second pad 14d is depicted in FIG. 3, the number of second pads 14d is not limited to one. The second pad 14d is electrically connected via a bonding wire 20 to the detecting element 16. The bonding wire 20 is one example of a connecting member.

The circuit element 14 includes a signal processing circuit which processes a signal outputted from the detecting element 16 and outputs the processed signal to the base substrate 12. For example, in Preferred Embodiment 1, the circuit element 14 includes a converter, a filter, a temperature sensor, a processor, a memory, and so forth. The converter converts a voltage signal outputted from the detecting element 16 to a digital signal. The filter filters the digital signal from the converter. The temperature sensor detects temperature. The processor corrects the filtered digital signal based on the detected temperature of the temperature sensor. The memory stores a correction coefficient for use in correcting the digital signal using the detected temperature, and so forth.

In Preferred Embodiment 1, the detecting element 16 is a pressure sensor element for measuring pressure. The detecting element 16 includes an upper surface 16a and a lower surface 16b, which is a back surface of the upper surface 16a. The detecting element 16 is, for example, a piezoresistance-type pressure sensor element or an electrostatic capacitance-type pressure sensor element, and a micro electro mechanical systems (MEMS) element. In Preferred Embodiment 1, the lower surface 16b of the detecting element 16 is adhered to the upper surface 12a of the base substrate 12 with a die attach film, a die attach material, or the like. Note that while the detecting element 16 is mounted on the upper surface 12a of the base substrate 12 in Preferred Embodiment 1, the detecting element 16 may be mounted on the circuit element 14.

The detecting element 16 includes a pad 16c on the upper surface 16a. While one pad 16c is depicted in FIG. 3, the number of pads 16c is not limited to one. The pad 16c is electrically connected via the bonding wire 20 to the second pad 14d of the circuit element 14. That is, the bonding wire 20 of the detecting element 16 is electrically connected via the circuit element 14 and the bonding wire 18 to the base substrate 12.

The detecting element 16 includes a detecting unit 16d, on which pressure acts, on the upper surface 16a. That is, the detecting unit 16d detects pressure. In Preferred Embodiment 1, the detecting unit 16d of the detecting element 16 as a pressure sensor element is a membrane or diaphragm which receives pressure. Note that the detecting unit 16d includes, for example, a passivation film to be made waterproof.

The resin package 22 is a package fabricated by molding hard resin such as, for example, thermosetting resin, on the upper surface 12a of the base substrate 12. That is, as depicted in FIG. 3, the resin package 22 is provided on the upper surface 12a of the base substrate 12. A portion (in particular, the pad 12b) of the upper surface 12a of the base substrate 12 is protected and made waterproof by being covered with the resin package 22.

As depicted in FIG. 3, the circuit element 14, the detecting element 16, and the bonding wires 18 and 20 are buried in the resin package 22. Buried inside the resin package 22, the circuit element 14 (in particular, the first pad 14c and the second pad 14d), the detecting element 16 (in particular, the pad 16c), and the bonding wires 18 and 20 are made waterproof so as to be protected.

As described above, electrical connection between the base substrate 12 and the circuit element 14 and electrical connection between the circuit element 14 and the detecting element 16 are made waterproof by the resin package 22.

As depicted in FIG. 1 and FIG. 3, the resin package 22 includes a base portion 23 and a protruding portion 24.

The base portion 23 configures a base substrate 12 side (Z-axis negative direction side) of the resin package 22. As depicted in FIG. 3, a lower surface 23a of the base portion 23 is in contact with the upper surface 12a of the base substrate 12.

The circuit element 14, the detecting element 16, and the bonding wires 18 and 20 are buried in the base portion 23.

The protruding portion 24 configures a side (Z-axis positive direction side), of the resin package 22, opposite to the base substrate 12 with respect to the base portion 23. The protruding portion 24 protrudes from the base portion 23 so as to be away from the base substrate 12. In other words, the protruding portion 24 protrudes from the base portion 23 to the Z-axis position direction (upward).

As depicted in FIG. 1 and FIG. 2, the protruding portion 24 is provided at a center portion of the base portion 23 in plan view. In other words, in plan view, the base portion 23 extends outward from an outer side surface 24a of the protruding portion 24.

The protruding portion 24 includes an exposure hole 22a. The exposure hole 22a penetrates through the protruding portion 24 to the Z-axis direction (up-down direction). The protruding portion 24 is cylindrical.

As depicted in FIG. 3, a portion of the upper surface 16a of the detecting element 16 and the detecting unit 16d face a lower end portion of the exposure hole 22a. That is, a portion of the upper surface 16a of the detecting element 16 and the detecting unit 16d are exposed via the exposure hole 22a outside the resin package 22. That is, the exposure hole 22a exposes the detecting unit 16d of the detecting element 16 outside the resin package 22. An opening of the exposure hole 22a is provided on an upper surface 24b (surface in the Z-axis position direction) of the protruding portion 24. That is, the resin package 22 exposes the detecting unit 16d of the detecting element 16 upward. Via a slit 27 of the lid member 26 described below and the exposure hole 22a, pressure acts on the detecting unit 16d of the detecting element 16 from outside the semiconductor device 10, and the detecting element 16 can measure that pressure.

As depicted in FIG. 2, in plan view, the protruding portion 24 is positioned around the detecting unit 16d of the detecting element 16. That is, in plan view, the protruding portion 24 is positioned outside the detecting unit 16d.

Note that in the detecting element 16, the detecting unit 16d, which is a portion exposed outside by the exposure hole 22a, is made waterproof by, for example, a passivation film. Also, in Preferred Embodiment 1, the shape of the opening of the exposure hole 22a is a circular or substantially circular shape when viewed from a top surface (Z-axis direction) as depicted in FIG. 1 and FIG. 2 and, as depicted in FIG. 3, is a tapered or substantially tapered shape with its cross-sectional area along an XY plane decreasing from the opening as being closer to the detecting unit 16d of the detecting element 16, but may be another shape. The exposure hole 22a may be any type or shape as long as it functions as a pressure introduction hole which introduces pressure to the detecting unit 16d.

As depicted in FIG. 1 to FIG. 3, the lid member 26 is supported by the upper surface 24b of the protruding portion 24 of the resin package 22 so as to close the exposure hole 22a. In Preferred Embodiment 1, the lid member 26 is attached to the upper surface 24b of the protruding portion 24 with an adhesive (not depicted). In Preferred Embodiment 1, the adhesive is applied over the entire circumference of the upper surface 24b of the protruding portion 24 in plan view. Note that the adhesive is depicted only in FIG. 8 and FIG. 9 of Preferred Embodiment 5 described below and its depiction is omitted in each of the other drawings.

As depicted in FIG. 1 and FIG. 2, in Preferred Embodiment 1, the lid member 26 has a disk shape or substantially disk shape. Note that the shape of the lid member 26 is not limited to a disk shape and may be, for example, a rectangular or substantially rectangular parallelepiped shape.

In Preferred Embodiment 1, the lid member 26 is configured of resin such as liquid-crystal polymer. Note that the lid member 26 may be configured of a material not limited to resin but may be configured of metal such as, for example, stainless steel (SUS). In Preferred Embodiment 1, the thickness (length in the Z-axis direction) of the lid member 26 is about 50 to about 200 (μm), and the diameter of the lid member 26 is about 2 to about 4 (mm), for example.

The lid member 26 includes a slit 27. In plan view, the slit 27 extends from an outer circumferential portion 26a of the lid member 26 toward a center portion 26b of the lid member 26. In other words, in plan view, the slit 27 extends from the outer circumferential portion 26a of the lid member 26 toward inside the lid member 26. The outer circumferential portion 26a of the lid member 26 is a portion formed of an outer side surface 26c of the lid member 26 and a nearby portion of the outer side surface 26c. The center portion 26b of the lid member 26 is a portion of the lid member 26 overlapping the exposure hole 22a in plan view.

In Preferred Embodiment 1, as depicted in FIG. 1 to FIG. 3, the slit 27 extends from the outer side surface 26c of the lid member 26 to the center portion 26b of the lid member 26. That is, in plan view, a portion (depth portion) of the slit 27 overlaps the exposure hole 22a. However, in Preferred Embodiment 1, as depicted in FIG. 2, in plan view, the depth portion of the slit 27 does not overlap the detecting unit 16d of the detecting element 16. That is, in Preferred Embodiment 1, in plan view, the slit 27 is at a position out of the detecting unit 16d of the detecting element 16. Note that the slit 27 may overlap the detecting unit 16d of the detecting element 16 in plan view.

The slit 27 opens upward (Z-axis positive direction side), downward (Z-axis negative direction side), and outward (radial direction radially extending from the center toward the outer circumferential portion 26a of the lid member 26 in plan view) of the lid member 26. The slit 27 opens downward, thereby communicating with the exposure hole 22a. The slit 27 opens upward and outward of the lid member 26, thereby communicating with the outside of the semiconductor device 10. With this, the slit 27 causes the outside of the semiconductor device 10 and the exposure hole 22a to communicate with each other.

In Preferred Embodiment 1, a width W (refer to FIG. 2) of the slit 27 is, for example, about 50 to about 500 (μm), but is not limited this.

The slit 27 (in detail, a space defined by the slit 27) is one example of a communicating portion. The space including the slit 27 is one example of a first space. It can also be said that inner side surfaces 27a, 27b, and 27c, of the lid member 26, configuring the slit 27 are one example of the communicating portion.

In Preferred Embodiment 1, as depicted in FIG. 2, in plan view, the outer circumferential portion 26a of the lid member 26 extends from the outer side surface 24a of the protruding portion 24 outward in the radial direction. In Preferred Embodiment 1, the outer circumferential portion 26a of the lid member 26 corresponds to an extending portion. That is, in Preferred Embodiment 1, the entirety of the outer circumferential portion 26a of the lid member 26 is an extending portion extending from the outer side surface 24a of the protruding portion 24 outward in plan view.

FIG. 4 is a sectional view of the semiconductor device of FIG. 3 in a state of being attached to an article of an electronic apparatus. As depicted in FIG. 3 and FIG. 4, the resin package 22 is configured so as to support an O ring OR.

As depicted in FIG. 4, the semiconductor device 10 is used as attached to a casing 2 of an electronic apparatus 1. The electronic apparatus 1 is, for example, a pressure measuring device, and includes the semiconductor device 10, the O ring OR, and the casing 2.

The O ring OR has an annular or substantially annular shape. The inner diameter of the O ring OR is configured to be equal to or substantially equal to the outer diameter of the protruding portion 24 of the resin package 22. The O ring OR includes a material or structure that is easy to compress and deform, such as nitrile rubber.

As indicated by broken lines in FIG. 3, the O ring OR is inserted from above to the protruding portion 24 of the resin package 22 before the lid member 26 is attached. The O ring OR inserted to the protruding portion 24 is arranged so as to surround the protruding portion 24 in plan view. In Preferred Embodiment 1, the inner diameter of the O ring OR is configured to be larger than the outer diameter of the protruding portion 24. With this, the above-described insertion is easily performed. After insertion of the O ring OR to the protruding portion 24, the lid member 26 is adhered to the upper surface 24b of the protruding portion 24.

As depicted in FIG. 3, the O ring OR inserted to the protruding portion 24 is restrained by the outer circumferential portion 26a of the lid member 26 from coming off from an upper end portion of the protruding portion 24. The O ring OR inserted to the protruding portion 24 is restricted by the base portion 23 of the resin package 22 from coming off from a lower end portion of the protruding portion 24.

As depicted in FIG. 4, the casing 2 includes an inner space 2a where the semiconductor device 10 with the O ring OR inserted thereto is arranged. The semiconductor device 10 arranged in the inner space 2a is attached to the casing 2 by known methods or materials (not depicted) such as fitting.

The casing 2 has a through hole 2b. The through hole 2b causes the outside and the inner space 2a of the casing 2 to communicate with each other. The exposure hole 22a of the semiconductor device 10 communicates with the outside of the electronic apparatus 1 via the slit 27 of the lid member 26, the inner space 2a of the casing 2, and the through hole 2b of the casing 2. With this, external pressure of the electronic apparatus 1 can be measured by the semiconductor device 10.

To seal a gap between the semiconductor device 10 arranged as described above and an inner circumferential surface 2c configuring the inner space 2a of the casing 2, the O ring OR is arranged in this gap.

In the state in which the semiconductor device 10 is arranged in the inner space 2a of the casing 2, a gap G between the outer side surface 24a of the protruding portion 24 and the inner circumferential surface 2c configuring the inner space 2a is shorter than a diameter R (refer to FIG. 3) of the O ring OR. Thus, when the semiconductor device 10 is arranged in the inner space 2a, the O ring OR is compressed and deformed (refer to FIG. 4). With this, an inner circumferential portion ORa of the O ring OR makes contact with the outer side surface 24a of the protruding portion 24, and an outer circumferential portion ORb of the O ring OR makes contact with the inner circumferential surface 2c configuring the inner space 2a. As a result, the gap between the semiconductor device 10 and the casing 2 is sealed, and liquid is prevented by the O ring OR from entering the inside of the electronic apparatus 1 from the outside of the electronic apparatus 1 via the gap.

According to Preferred Embodiment 1, the outer circumferential portion 26a of the lid member 26 is an extending portion extended from the outer side surface 24a of the protruding portion 24 outward in the radial direction. Thus, when the O ring OR is arranged so as to surround the protruding portion 24 in plan view, the O ring OR is restrained by the extending portion from coming off from above.

If the semiconductor device 10 does not include the lid member 26, there is a fear that a foreign matter falling from above may make contact with the detecting unit 16d via the exposure hole 22a to influence detection of pressure by the detecting unit 16d. According to Preferred Embodiment 1, since the exposure hole 22a is covered with the lid member 26, a foreign matter falling from above is prevented from entering the exposure hole 22a.

To cause pressure from outside to act on the detecting unit 16d while the exposure hole 22a is closed with the lid member 26, it is thought that a through hole penetrating through the lid member 26 in the up-down direction (Z-axis direction) to cause the outside and the exposure hole 22a to communicate with each other is provided. However, when the through hole is closed with a foreign matter falling from above, it is not possible to cause pressure from outside to act on the detecting unit 16d. However, according to Preferred Embodiment 1, pressure from outside is caused to act on the detecting unit 16d from sideward of the semiconductor device 10 via the slit 27 and the exposure hole 22a. Thus, a possibility that a foreign matter falling from above reach the exposure hole 22a can be decreased.

According to Preferred Embodiment 1, only with the slit 27 provided in the lid member 26, the function of the communicating portion can be achieved.

According to Preferred Embodiment 1, the lid member 26 is open by the slit 27 not only sideward but also upward. Thus, the slit 27 can cause the exposure hole 22a and the outside of the semiconductor device 10 to communicate with each other not only sideward but also upward of the semiconductor device 10. Since this facilitates circulation of the fluid from outside to the exposure hole 22a, responsiveness of the detecting unit 16d which detects pressure of the fluid can be improved. Also, even if a portion above the slit 27 is closed with a foreign matter, communication from sideward of the semiconductor device 10 to the exposure hole 22a can be maintained.

According to Preferred Embodiment 1, a possibility that a foreign matter falling from above makes contact with the detecting unit 16d via the slit 27 can be decreased.

According to Preferred Embodiment 1, in the electronic apparatus 1 including the semiconductor device 10, the O ring OR can be restrained by the outer circumferential portion 26a of the lid member 26 from coming off from above.

The structure of the shape of the resin package 22 and so forth is not limited to the above-described structure (structure depicted in FIG. 1 to FIG. 4). For example, while the base portion 23 of the resin package 22 has a rectangular or substantially rectangular shape in plan view in Preferred Embodiment 1, the base portion 23 may have a shape other than a rectangle (for example, circular shape) in plan view.

In Preferred Embodiment 1, the circuit element 14 is electrically connected via the bonding wire 18 to the base substrate 12, and the detecting element 16 is electrically connected via the bonding wire 20 to the circuit element 14. However, the connection mode among the base substrate 12, the circuit element 14, and the detecting element 16 is not limited to this. For example, as with the circuit element 14, the detecting element 16 may be connected via a bonding wire to the base substrate 12. In this case, the detecting element 16 is electrically connected via the base substrate 12 to the circuit element 14.

In Preferred Embodiment 1, the base substrate 12, the circuit element 14, and the detecting element 16 were each electrically connected via a bonding wire. However, the base substrate 12, the circuit element 14, and the detecting element 16 may be electrically connected by methods or structures other than a bonding wire. For example, the circuit element 14 may be mounted on the base substrate 12 with a flip chip. In this case, the circuit element 14 and the base substrate 12 are electrically connected together by soldering.

Preferred Embodiment 2

Figure 5:
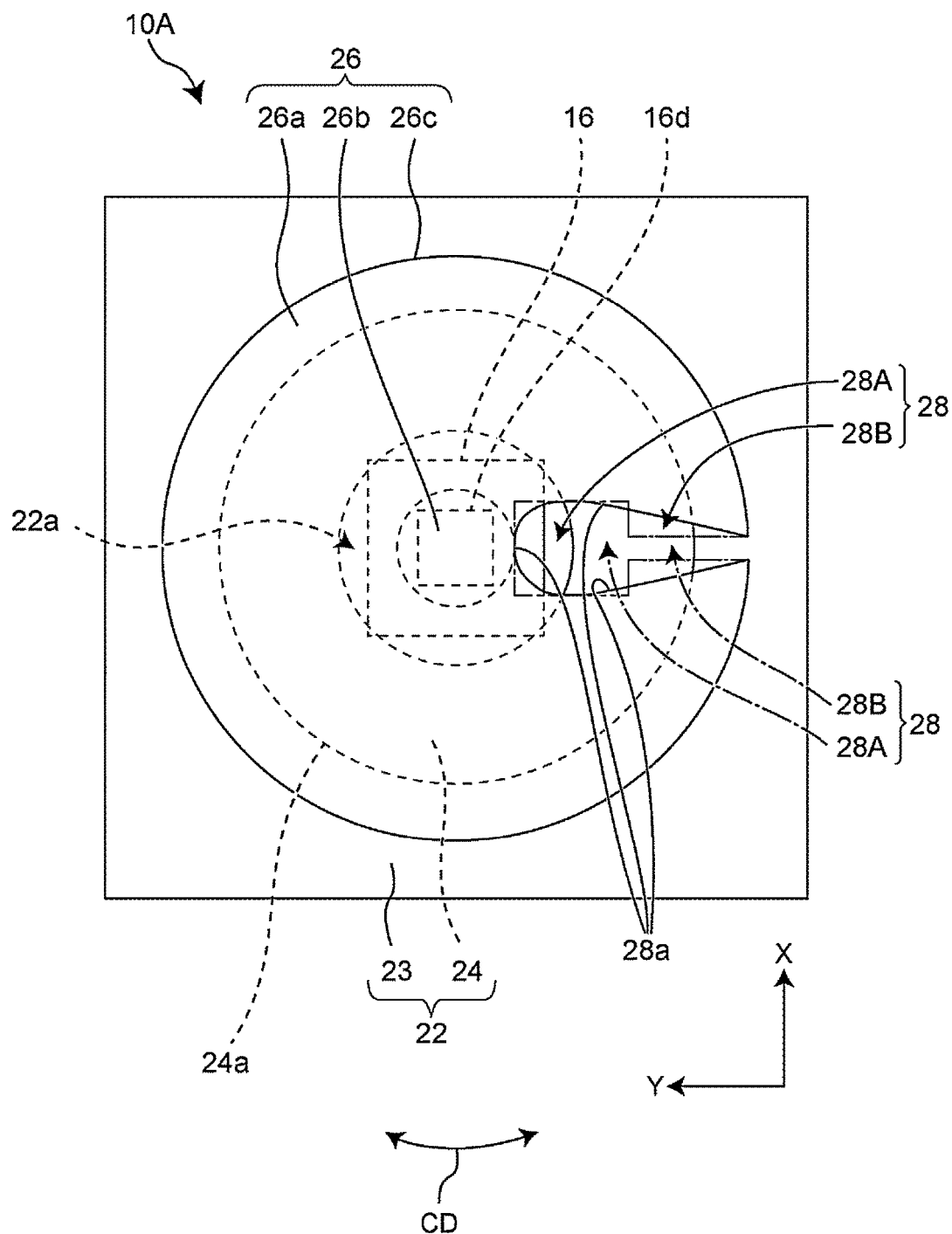
FIG. 5 is a plan view of a semiconductor device according to Preferred Embodiment 2 of the present invention.

FIG. 5 is a plan view of a semiconductor device according to Preferred Embodiment 2 of the present invention. A semiconductor device 10A according to Preferred Embodiment 2 is different from the semiconductor device 10 according to Preferred Embodiment 1 in that the lid member 26 includes a slit 28 in place of the slit 27.

As depicted in FIG. 5, as with the slit 27 depicted in FIG. 2, the slit 28 is formed from the outer circumferential portion 26a of the lid member 26 toward the center portion 26b of the lid member 26.

The slit 28 includes a wide portion 28A and a narrow portion 28B. The wide portion 28A is longer than the narrow portion 28B in a width direction. In Preferred Embodiment 2, the width direction is the X-axis direction.

The wide portion 28A configures a depth portion of the slit 28. At least a portion of the wide portion 28A overlaps the exposure hole 22a in plan view. In Preferred Embodiment 2, the wide portion 28A does not overlap the detecting unit 16d of the detecting element 16 in plan view, but may overlap it.

The narrow portion 28B configures a portion other than the depth portion of the slit 28. One end portion of the narrow portion 28B is connected to the wide portion 28A. The other end portion of the narrow portion 28B opens to the outer side surface 26c of the lid member 26. The narrow portion 28B is positioned outside the exposure hole 22a in a radial direction of the lid member 26 in plan view. That is, the narrow portion 28B does not overlap the exposure hole 22a in plan view.

The slit 28 (in detail, a space defined by the slit 28) is one example of the communicating portion. The space defined by the slit 28 is one example of the first space. It can also be said that an inner side surface 28a, of the lid member 26, configuring the slit 28 is one example of the communicating portion.

In Preferred Embodiment 2, the slit 28 has a tapered shape which becomes narrower toward outside in the radial direction of the lid member 26. However, the shape of the slit 28 is not limited to the tapered shape. For example, as indicated by one-dot-chain lines in FIG. 5, the slit 28 may include a step at a boundary portion between the wide portion 28A and the narrow portion 28B.

According to Preferred Embodiment 2, circulation of the fluid between above the lid member 26 and the exposure hole 22a is facilitated by the wide portion 28A. Thus, responsiveness of the detecting unit 16d which detects pressure of the fluid can be improved.

According to Preferred Embodiment 2, the width of the slit 28 is narrow at a portion not overlapping the exposure hole 22a in plan view, that is, a portion where the lid member 26 and the upper surface 24b of the protruding portion 24 are in contact with each other. Thus, the contact area between the lid member 26 and the protruding portion 24 can be increased. This stabilizes the lid member 26.

Preferred Embodiment 3

Figure 6:
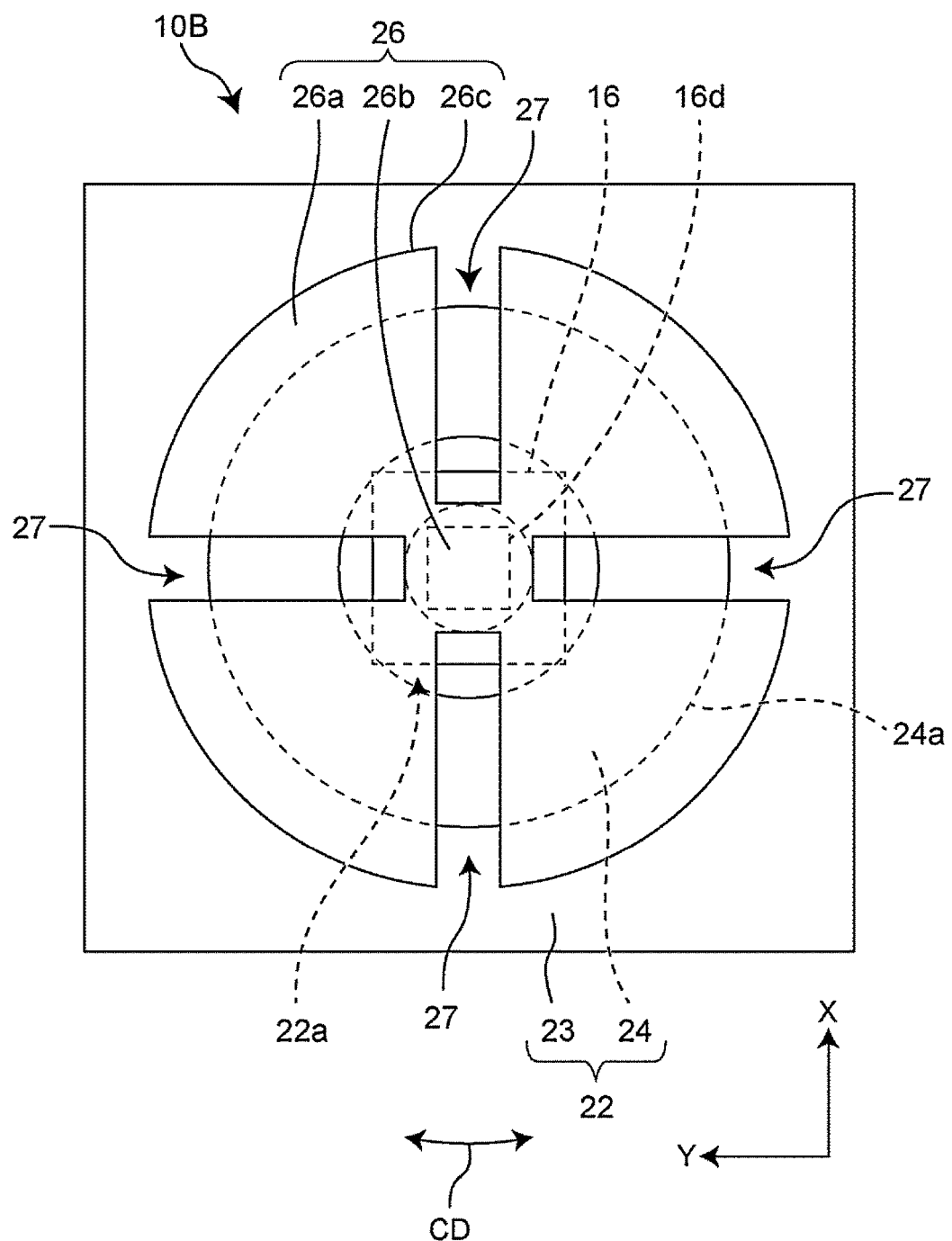
FIG. 6 is a plan view of a semiconductor device according to Preferred Embodiment 3 of the present invention.

FIG. 6 is a plan view of a semiconductor device according to Preferred Embodiment 3 of the present invention. A semiconductor device 10B according to Preferred Embodiment 3 is different from the semiconductor device 10 according to Preferred Embodiment 1 in that the lid member 26 includes a plurality of slits 27.

As depicted in FIG. 6, the lid member 26 of the semiconductor device 10B includes four slits 27. The four slits 27 are equidistantly spaced in a circumferential direction CD of the lid member 26. In other words, the four slits 27 are arranged with 90-degree pitches in the circumferential direction CD.

Note that the number of slits 27 included in the lid member 26 is not limited to four. Also, the plurality of respective slits 27 may be arranged with different pitches in the circumferential direction CD of the lid member 26. Also, the width of each slit 27 may be equal as depicted in FIG. 6 or may be different. Also, the width of each slit 27 is not limited to the width depicted in FIG. 6.

According to Preferred Embodiment 3, when the semiconductor device 10B includes three or more slits 27 and the lid member 26 is supported by the upper surface 24b of the protruding portion 24, the outer side surface 24a of the protruding portion 24 is visually recognized at three or more locations via the respective three or more slits 27 provided. With this, positioning of the lid member 26 with respect to the protruding portion 24 can be accurately performed.

Preferred Embodiment 4

Figure 7:
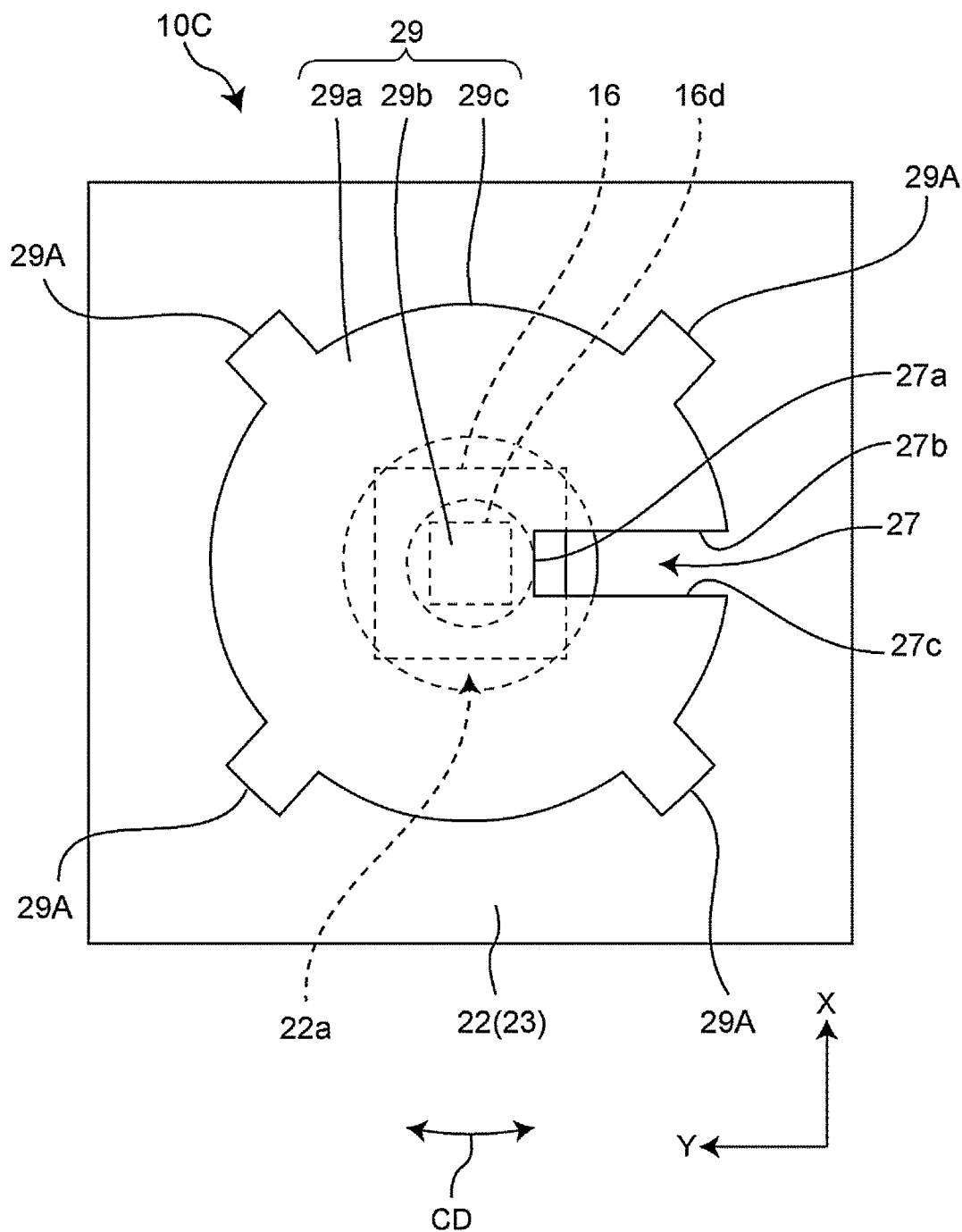
FIG. 7 is a plan view of a semiconductor device according to Preferred Embodiment 4 of the present invention.

FIG. 7 is a plan view of a semiconductor device according to Preferred Embodiment 4 of the present invention. A semiconductor device 10C according to Preferred Embodiment 4 is different from the semiconductor device 10 according to Preferred Embodiment 1 in that the semiconductor device 10C includes a lid member 29 in place of the lid member 26.

As with the lid member 26 (refer to FIG. 2) of the semiconductor device 10 of Preferred Embodiment 1, the lid member 29 is supported by the upper surface 24b of the protruding portion 24 of the resin package 22 so as to close the exposure hole 22a, and has the slit 27. The slit 27 has the same structure as that of the lid member 26 (refer to FIG. 2) of the semiconductor device 10 of Preferred Embodiment 1.

In Preferred Embodiment 3, the lid member 29 has a disk shape or substantially disk shape. The diameter of the lid member 29 is equal to or smaller than the outer diameter of the protruding portion 24. In FIG. 7, the diameter of the lid member 29 is equal to the outer diameter of the protruding portion 24. The lid member 29 includes four extending portions 29A. Each extending portion 29A extends from an outer side surface 29c of the lid member 29 toward outside in a radial direction of the lid member 29. The radial direction of the lid member 29 is a direction radially extending from the center of the lid member 29 toward an outer circumferential portion 29a in plan view.

The four extending portions 29A are equidistantly spaced in the circumferential direction CD of the lid member 29. In other words, the four extending portions 29A are arranged with 90-degree pitches in the circumferential direction CD. In Preferred Embodiment 4, a nearby portion of an outer side surface 29c in the outer circumferential portion 29a of the lid member 29 includes not only an inner portion in the radial direction with respect to the outer side surface 29c in plan view but also the four extending portions 29A, which are outer portions in the radial direction with respect to the outer side surface 29c in plan view. That is, in Preferred Embodiment 4, the lid member 29 includes the extending portions 29A at a portion of the outer circumferential portion 29a.

Note that the number of extending portions 29A included in the lid member 29 is not limited to four. Also, the plurality of respective extending portions 29A may be arranged with different pitches in the circumferential direction CD of the lid member 29. Also, the length of each extending portion 29A in the circumferential direction CD is not limited to the length depicted in FIG. 7.

Preferred Embodiment 5

Figure 8:
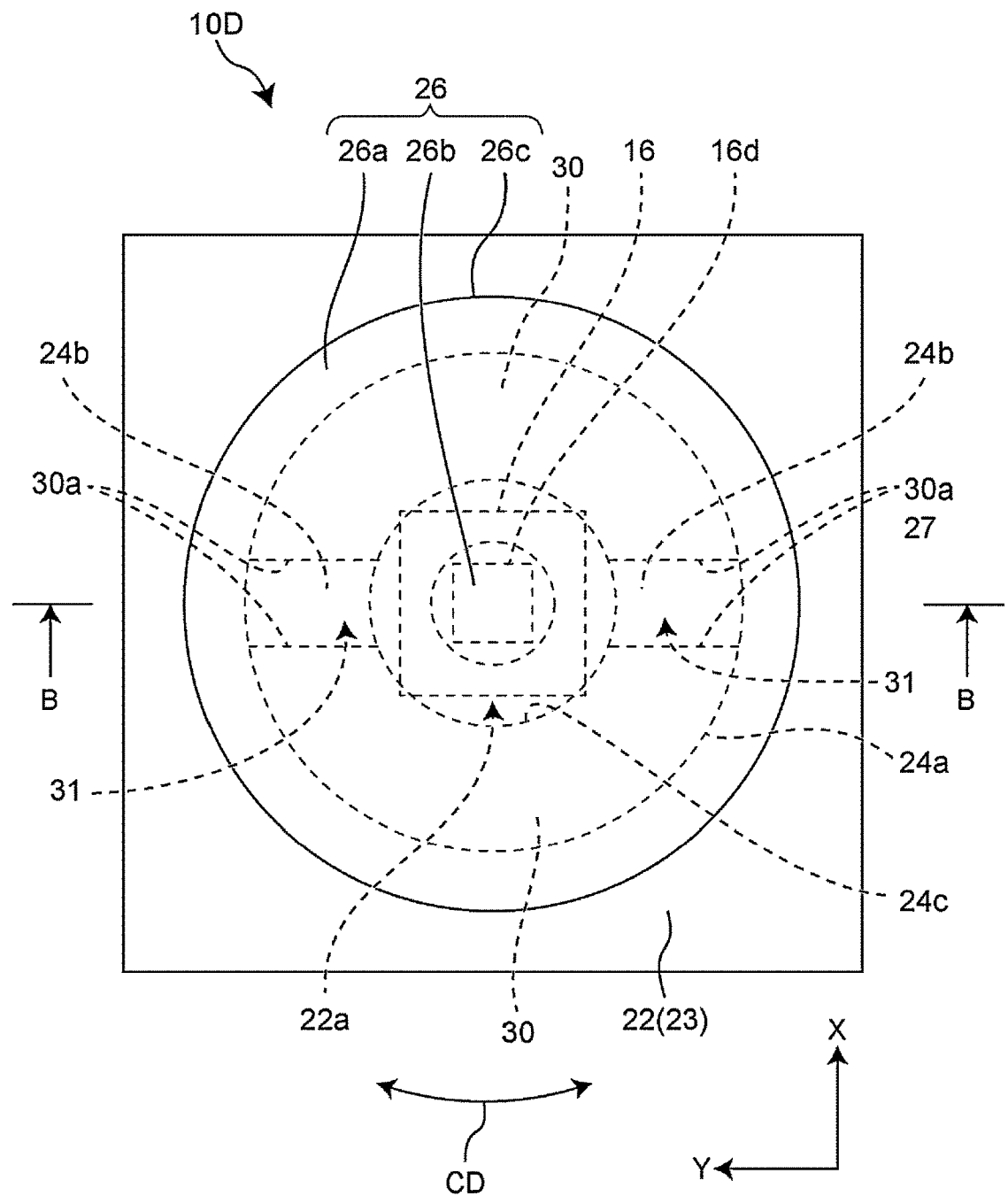
FIG. 8 is a plan view of a semiconductor device according to Preferred Embodiment 5 of the present invention.
Figure 9:
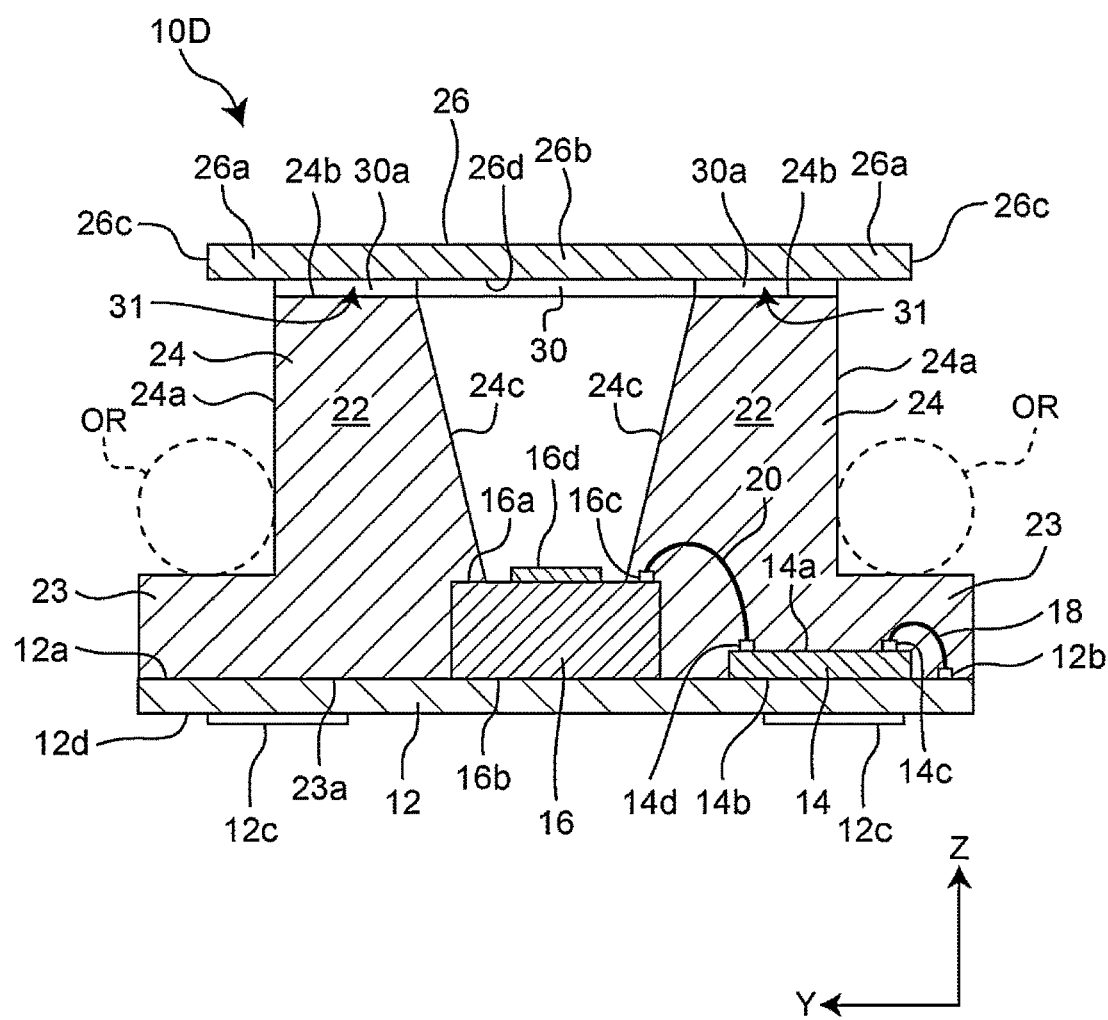
FIG. 9 is a sectional view along a B-B line of FIG. 8.

FIG. 8 is a plan view of a semiconductor device according to Preferred Embodiment 5 of the present invention. FIG. 9 is a sectional view along a B-B line of FIG. 8. A semiconductor device 10D according to Preferred Embodiment 5 is different from the semiconductor device 10 according to Preferred Embodiment 1 in that the lid member 26 does not include the slit 27 and there are portions between the lid member 26 and the upper surface 24b of the protruding portion 24 where an adhesive is not interposed.

As depicted in FIG. 8, the lid member 26 of the semiconductor device 10D does not include the slit 27 as depicted in FIG. 2.

As depicted in FIG. 9, the lid member 26 is attached to the upper surface 24b of the protruding portion 24 with an adhesive. An adhering portion 30 configured of the adhesive is interposed between the protruding portion 24 and the lid member 26. In Preferred Embodiment 5, at two locations of the upper surface 24b of the protruding portion 24 in the circumferential direction CD in plan view, there are portions to which the adhesive is not applied. In other words, in Preferred Embodiment 5, between a lower surface 26d of the lid member 26 and the upper surface 24b of the protruding portion 24, there are portions where the adhering portion 30 is not interposed. In those portions, spaces 31 are provided between the lower surface 26d of the lid member 26 and the upper surface 24b of the protruding portion 24. That is, the lower surface 26d of the lid member 26 and the upper surface 24b of the protruding portion 24 are opposed to each other via the spaces 31 in the Z-axis direction.

As depicted in FIG. 8, each space 31 extends from the outer side surface 24a to an inner side surface 24c of the protruding portion 24. The inner side surface 24c of the protruding portion 24 is a surface configuring the exposure hole 22a. That is, via each space 31, the exposure hole 22a and the outside of the semiconductor device 10D communicate with each other.

In Preferred Embodiment 5, in plan view, the two spaces 31 are opposed to each other across the detecting unit 16d of the detecting element 16. In other words, the two spaces 31 are arranged with 180-degree pitches in the circumferential direction CD.

Note that the number of spaces 31 between the lower surface 26d of the lid member 26 and the upper surface 24b of the protruding portion 24 is not limited to two. Also, the position where each space 31 is located is not limited to the position depicted in FIG. 8. Also, the two spaces 31 may be arranged in the circumferential direction CD with pitches other than 180-degree pitches. For example, between the two spaces 31, a narrower pitch in the circumferential direction CD may be 90 degrees and a wider pitch in the circumferential direction CD may be 270 degrees. Also, when three or more spaces 31 are provided, the respective spaces 31 may be equidistantly arranged in the circumferential direction CD or may be arranged with different pitches. Also, the length of each space 31 in the circumferential direction CD is not limited to the length depicted in FIG. 8. Also, the length of each space 31 in the circumferential direction CD may be equal as depicted in FIG. 8 or different.

The space 31 is one example of the communicating portion. Also, the space 31 is one example of a second space. It can also be said that the lower surface 26d of the lid member 26, the upper surface 24b of the protruding portion 24, and side end portions 30a of the adhering portion 30, which configure the space 31, are one example of the communicating portion.

According to Preferred Embodiment 5, when the lid member 26 is adhered to the protruding portion 24, by only providing the space 31 where no adhesive is applied partially between the lid member 26 and the protruding portion 24, the space 31 can be made function as the communicating portion.

Preferred Embodiment 6

Figure 10:
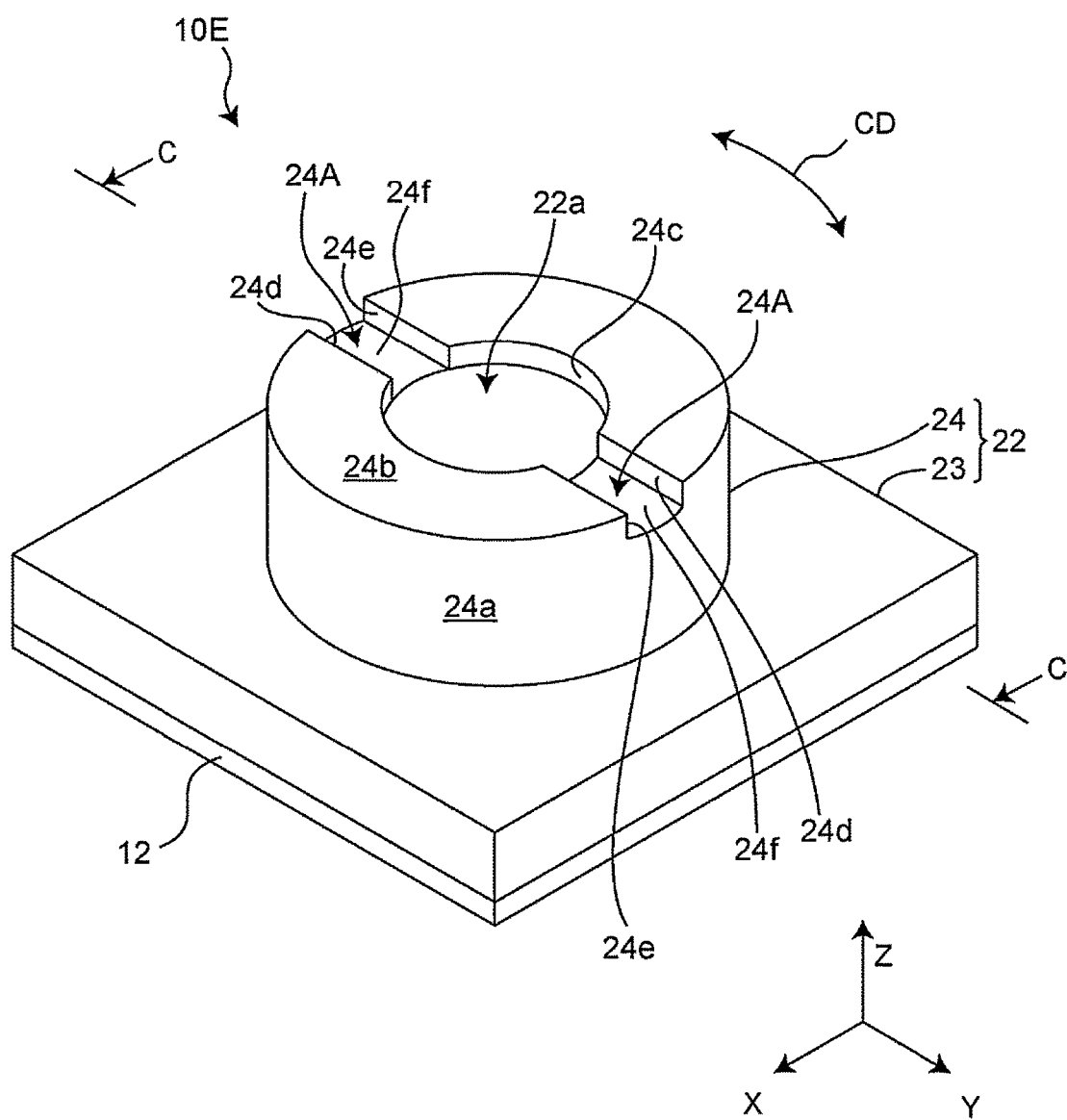
FIG. 10 is a perspective view of a semiconductor device according to Preferred Embodiment 6 of the present invention.
Figure 11:
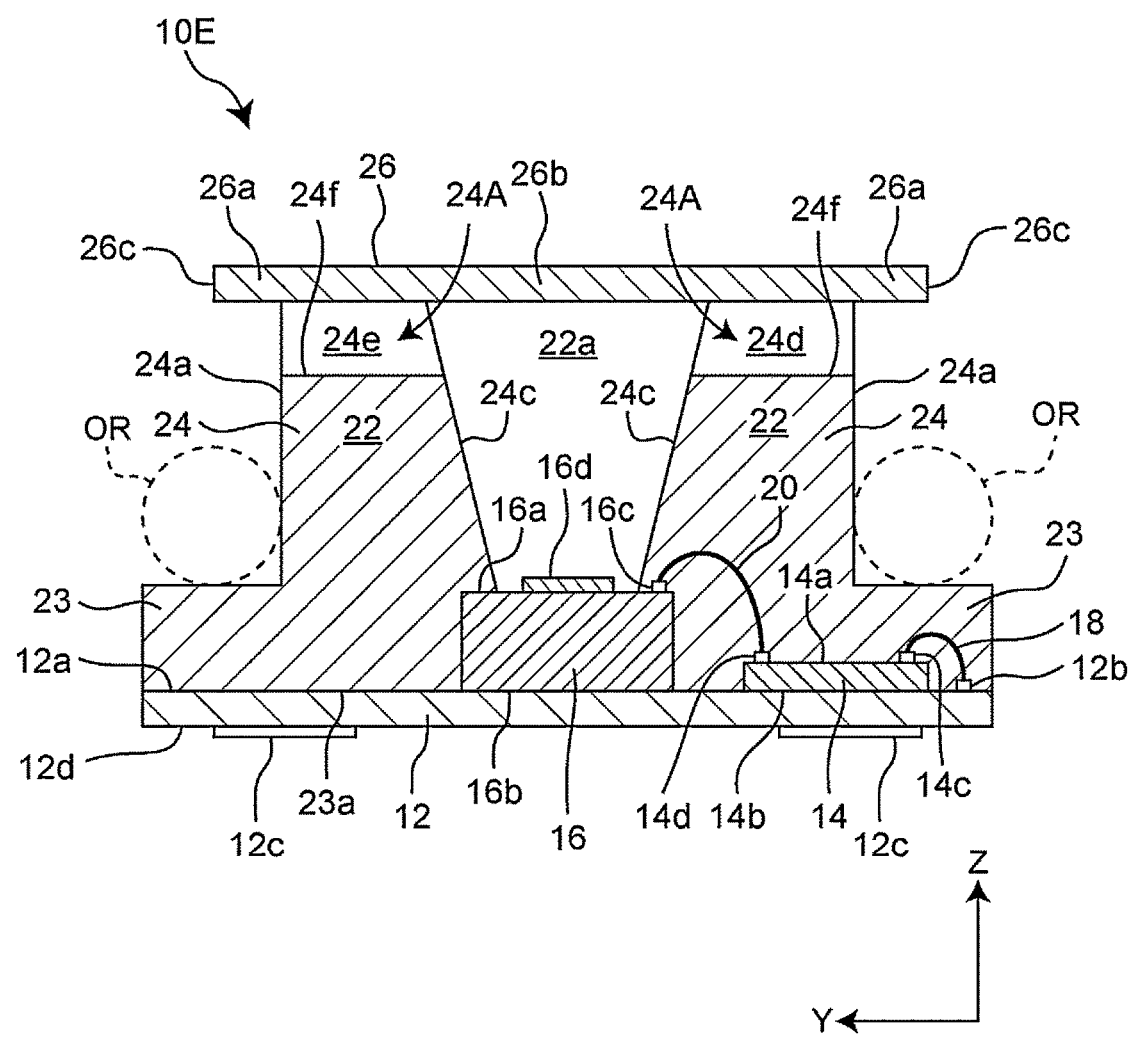
FIG. 11 is a sectional view along a C-C line of FIG. 10.

FIG. 10 is a perspective view of a semiconductor device according to Preferred Embodiment 6 of the present invention. FIG. 11 is a sectional view along a C-C line of FIG. 10. Note that depiction of the lid member 26 is omitted in FIG. 10. A semiconductor device 10E according to Preferred Embodiment 6 is different from the semiconductor device 10 according to Preferred Embodiment 1 in that the lid member 26 does not include the slit 27 and the protruding portion 24 of the resin package 22 includes concave portions 24A.

As depicted in FIG. 11, the lid member 26 of the semiconductor device 10E does not include the slit 27 as depicted in FIG. 2.

As depicted in FIG. 10, the protruding portion 24 of the resin package 22 includes two concave portions 24A. The concave portions 24A each are one example of a first concave portion. Each concave portion 24A is formed with the upper surface 24b of the protruding portion 24 recessed downward. Each concave portion 24A is formed from the outer side surface 24a to the inner side surface 24c of the protruding portion 24. That is, as depicted in FIG. 10 and FIG. 11, via each concave portion 24A, the exposure hole 22a and the outside of the semiconductor device 10E communicate with each other.

In Preferred Embodiment 6, as depicted in FIG. 10, the two concave portions 24A are positioned on one straight line in the Y-axis direction. In other words, the two concave portions 24A are arranged with 180-degree pitches in the circumferential direction CD.

Note that the number of concave portions 24A included in the protruding portion 24 is not limited to two. Also, the position where each concave portion 24A is formed is not limited to the position depicted in FIG. 10. Also, the two concave portions 24A may be arranged in the circumferential direction CD with pitches other than 180-degree pitches. For example, between the two concave portions 24A, a narrower pitch in the circumferential direction CD may be 90 degrees and a wider pitch in the circumferential direction CD may be 270 degrees. Also, when three or more concave portions 24A are provided, the respective concave portions 24A may be equidistantly arranged in the circumferential direction CD or may be arranged with different pitches. Also, the length of each concave portion 24A in the circumferential direction CD is not limited to the length depicted in FIG. 10. Also, the length of each concave portion 24A in the circumferential direction CD may be equal as depicted in FIG. 10 or different. Also, in Preferred Embodiment 6, the depth (length in the Z-axis direction) of each concave portion 24A is, for example, about 10 to about 100 (μm), but is not limited to this.

The concave portion 24A (in detail, a space defined by the concave portions 24A) is one example of the communicating portion. A space defined by the concave portion 24A is one example of a third space. It can also be said that paired inner side surfaces 24d and 24e and an inner bottom surface 24f of the protruding portion 24, which configure the concave portion 24A, are one example of the communicating portion.

According to Preferred Embodiment 6, by only providing the concave portions 24A in the protruding portion 24, the function of the communicating portion can be achieved.

Preferred Embodiment 7

Figure 12:
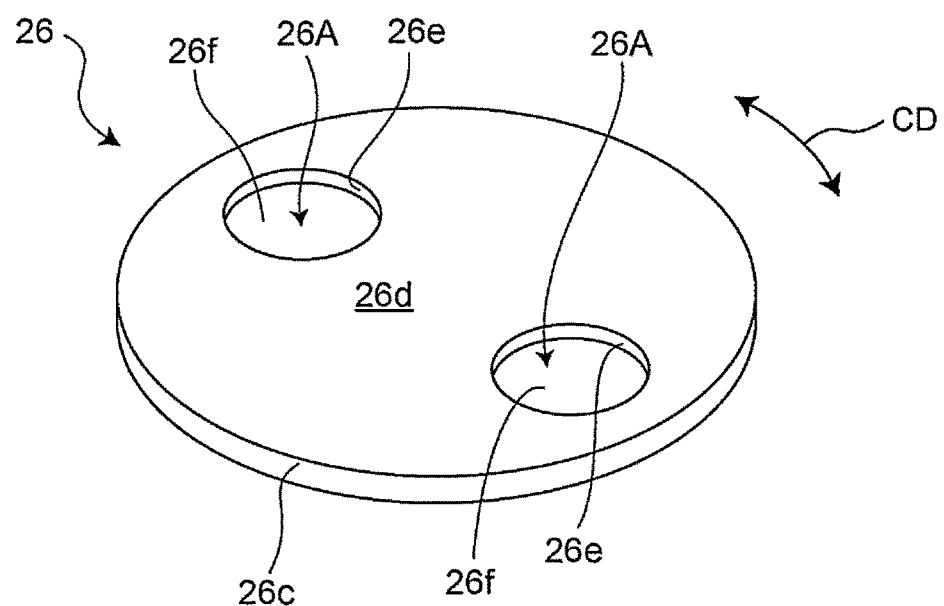
FIG. 12 is a perspective view of a lid member included in a semiconductor device according to Preferred Embodiment 7 of the present invention from a bottom surface side.
Figure 13:
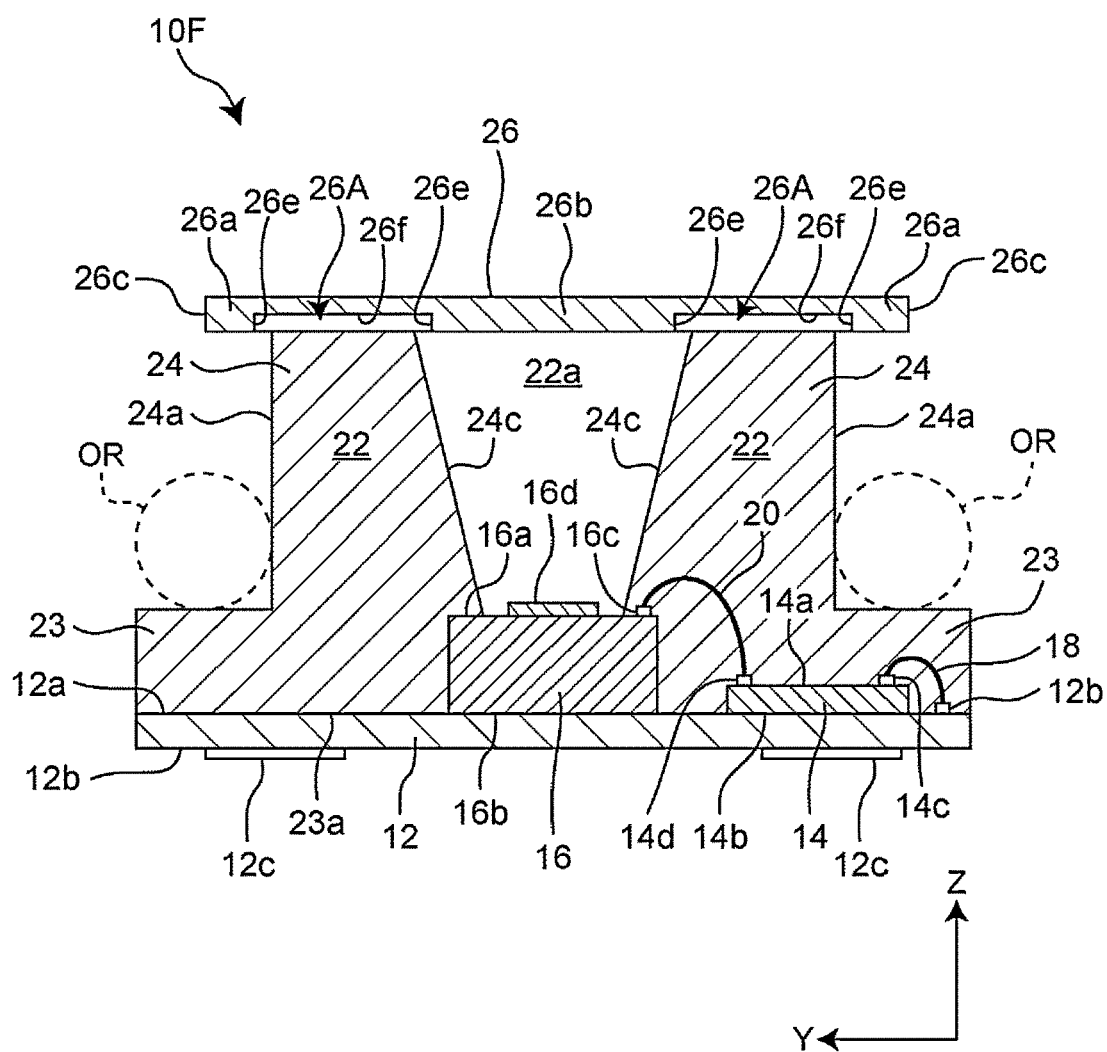
FIG. 13 is a longitudinal sectional view of the semiconductor device according to Preferred Embodiment 7 of the present invention.

FIG. 12 is a perspective view of a lid member included in a semiconductor device according to Preferred Embodiment 7 of the present invention from a bottom surface side. FIG. 13 is a longitudinal sectional view of the semiconductor device according to Preferred Embodiment 7. A semiconductor device 10F according to Preferred Embodiment 7 is different from the semiconductor device 10 according to Preferred Embodiment 1 in that the lid member 26 does not include the slit 27 but includes concave portions 26A.

As depicted in FIG. 12, the lid member 26 of the semiconductor device 10F does not include the slit 27 as depicted in FIG. 2.

The lid member 26 includes two concave portions 26A. The concave portions 26A each are one example of a second concave portion. Each concave portion 26A is formed with the lower surface 26d of the lid member 26 recessed upward.

As depicted in FIG. 13, each concave portion 26A extends from the inner side surface 24c of the protruding portion 24 of the resin package 22 to an exposure hole 22a side in the Y-axis direction. With this, each concave portion 26A communicates with the exposure hole 22a. Each concave portion 26A extends outward from the outer side surface 24a of the protruding portion 24 in the Y-axis direction. With this, each concave portion 26A communicates with the outside of the semiconductor device 10F. As described above, via each concave portion 26A, the exposure hole 22a and the outside of the semiconductor device 10F communicate with each other.

In Preferred Embodiment 7, as depicted in FIG. 13, the two concave portions 26A are positioned on one straight line in the Y-axis direction. In other words, as depicted in FIG. 12, the two concave portions 26A are arranged with 180-degree pitches in the circumferential direction CD.

Note that the number of concave portions 26A included in the protruding portion 26 is not limited to two. Also, the position where each concave portion 26A is located is not limited to the position depicted in FIG. 12. Also, the two concave portions 26A may be arranged in the circumferential direction CD with pitches other than 180-degree pitches. For example, between the two concave portions 26A, a narrower pitch in the circumferential direction CD may be 90 degrees and a wider pitch in the circumferential direction CD may be 270 degrees. Also, when three or more concave portions 26A are formed, the respective concave portions 26A may be equidistantly arranged in the circumferential direction CD or may be arranged with different pitches. Also, the size and shape of each concave portion 26A are not limited to the size and shape depicted in FIG. 12. For example, in Preferred Embodiment 7, the depth of each concave portion 26A is, about 10 to about 100 (µm), but is not limited to this. Also, the size and shape of each concave portion 26A may be equal or different.

The concave portion 26A (in detail, a space defined by the concave portions 26A) is one example of the communicating portion. A space defined by the concave portion 26A is one example of a fourth space. It can also be said that an inner side surface 26e and an inner bottom surface 26f, of the lid member 26, configuring the concave portion 26A are one example of the communicating portion.

According to Preferred Embodiment 7, by only providing the concave portions 26A in the protruding portion 26, the function of the communicating portion can be achieved.

Preferred Embodiment 8

Figure 14:
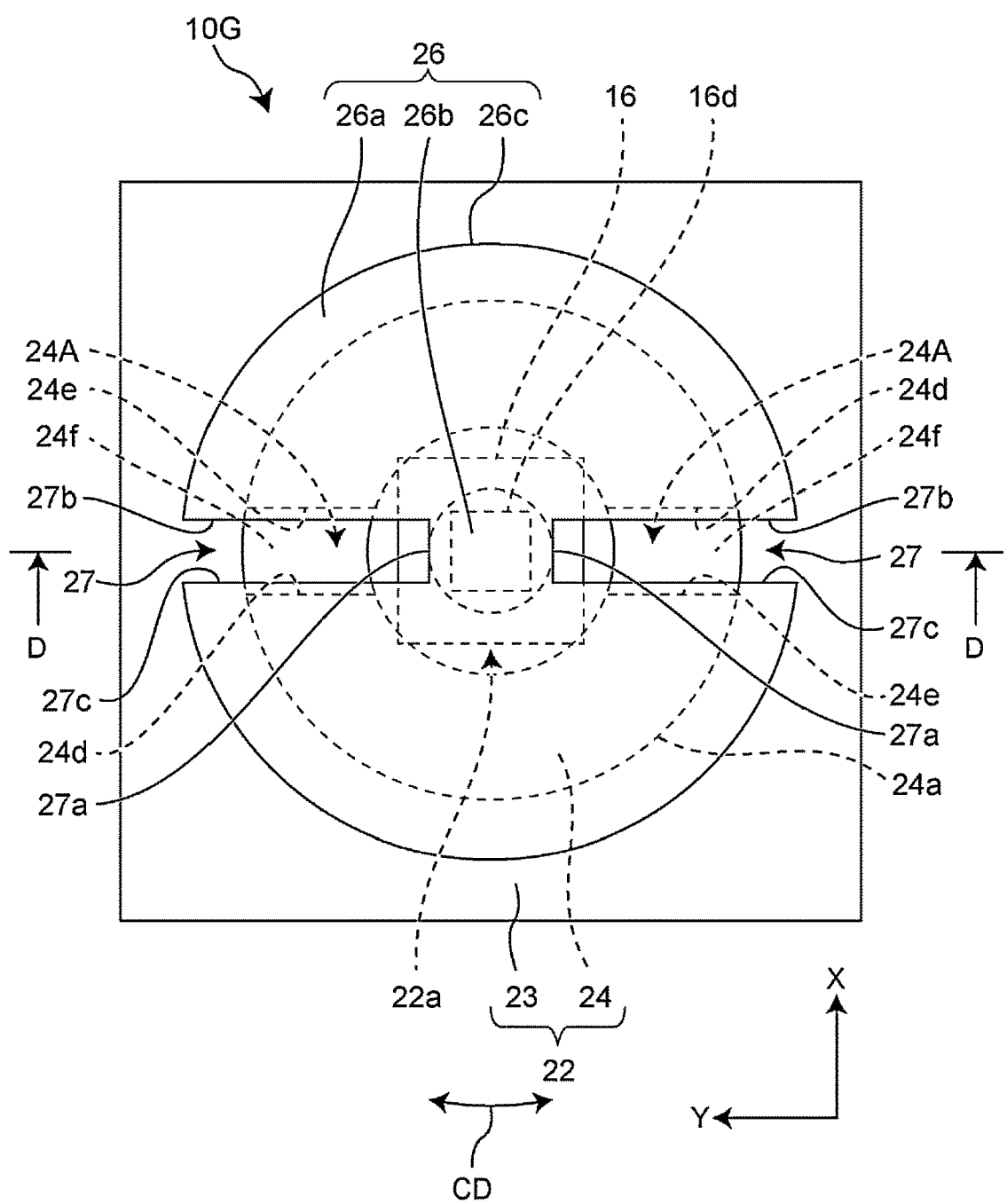
FIG. 14 is a plan view of a semiconductor device according to Preferred Embodiment 8 of the present invention.
Figure 15:
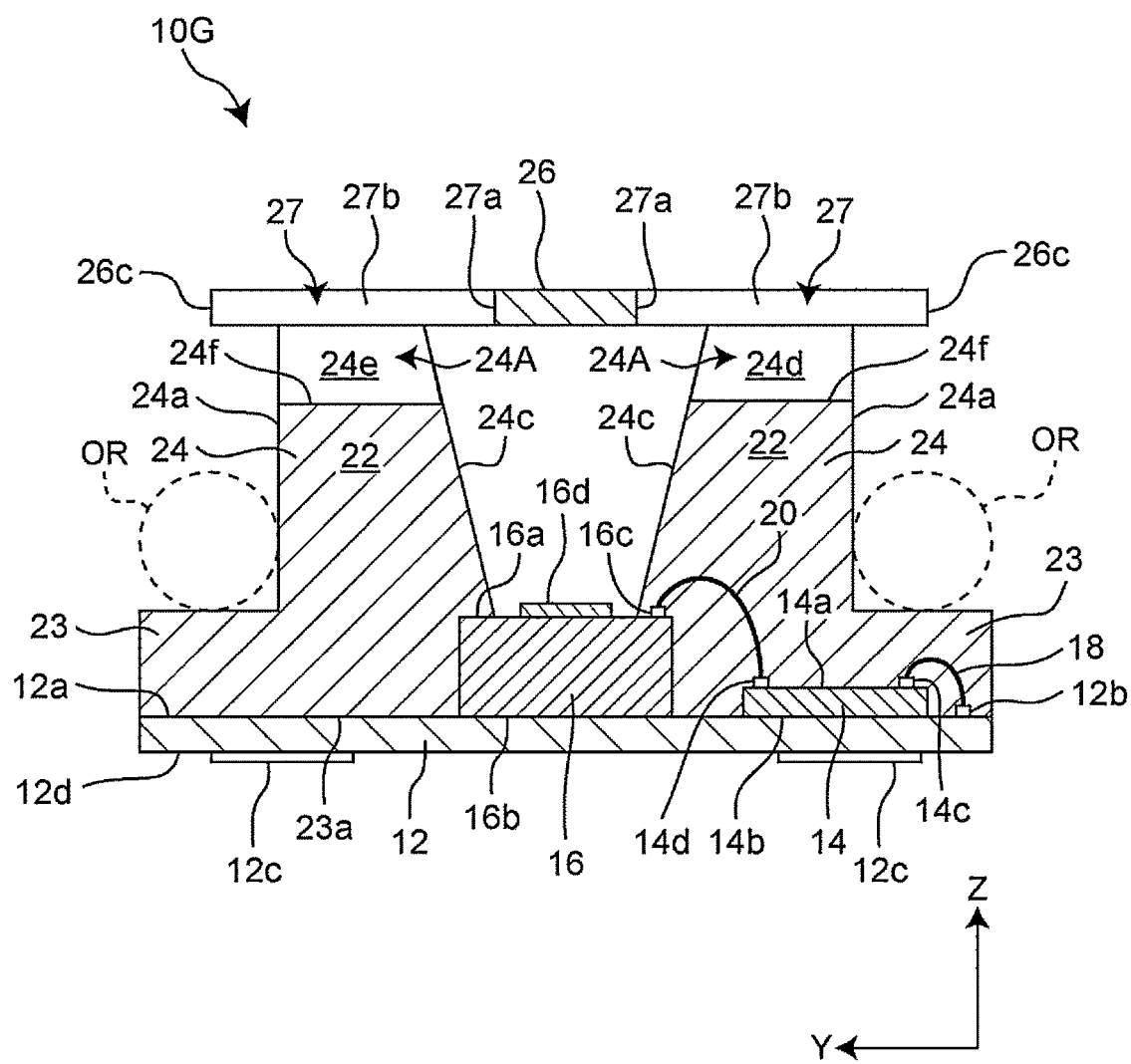
FIG. 15 is a sectional view along a D-D line of FIG. 14.

FIG. 14 is a plan view of a semiconductor device according to Preferred Embodiment 8 of the present invention. FIG. 15 is a sectional view along a D-D line of FIG. 14. A semiconductor device 10G according to Preferred Embodiment 8 is different from the semiconductor device 10 according to Preferred Embodiment 1 in that the lid member 26 includes the slit 27 and the protruding portion 24 of the resin package 22 includes the concave portions 24A.

As depicted in FIG. 14 and FIG. 15, the lid member 26 of the semiconductor device 10G includes two slits 27. Note that the number, formation positions, shape, and size of the slits 27 included in the lid member 26 can be any.

As with Preferred Embodiment 6, the protruding portion 24 of the resin package 22 of the semiconductor device 10G includes two concave portions 24A. Note that the number, formation positions, shape, and size of the concave portions 24A included in the protruding portion 24 can be any.

A communicating portion includes each slit 27 and each concave portion 24A. In detail, the communicating portion includes a first space defined by each slit 27 and a third space defined by each concave portion 24A.

As depicted in FIG. 14, in plan view, the slits 27 and the concave portions 24A overlap each other. That is, in plan view, the first space and the third space overlap each other. With this, as depicted in FIG. 15, the first space defined by each slit 27 and the third space defined by each concave portion 24A communicate with each other.

In the semiconductor device 10G depicted in FIG. 14 and FIG. 15, the lid member 26 includes the slits 27, and the protruding portion 24 of the resin package 22 includes the concave portions 24A.

However, the semiconductor device 10G according to Preferred Embodiment 8 may include, in addition to the slits 27 and the concave portions 24A or in place of the slits 27 and the concave portions 24A, at least one of the adhering portion 30 and the concave portions 26A. That is, the semiconductor device 10G according to Preferred Embodiment 8 is only required to include at least two of the slits 27, the adhering portion 30, the concave portions 24A, and the concave portions 26A. As described in Preferred Embodiment 5, the adhering portion 30 is interposed between the protruding portion 24 and the lid member 26. As described in Preferred Embodiment 7, the concave portions 26A are provided in the lower surface 26d of the lid member 26.

When the lid member 26 of the semiconductor device 10G according to Preferred Embodiment 8 includes the slits 27, a communicating portion of the semiconductor device 10G includes a first space defined by each slit 27.

When the semiconductor device 10G according to Preferred Embodiment 8 includes the adhering portion 30, the adhering portion 30 is not applied over the entire circumference of the upper surface 24b of the protruding portion 24 in plan view. In this case, the communicating portion of the semiconductor device 10G includes the space 31 (second space) provided in a portion to which the adhering portion 30 is not applied.

When the protruding portion 24 of the resin package 22 of the semiconductor device 10G according to Preferred Embodiment 8 includes the concave portions 24A, the communicating portion of the semiconductor device 10G includes a third space defined by each concave portion 24A.

When the lid member 26 of the semiconductor device 10G according to Preferred Embodiment 8 includes the concave portions 26A, the communicating portion of the semiconductor device 10G includes a fourth space defined by each concave portion 26A.

As described above, the communicating portion of the semiconductor device 10G according to Preferred Embodiment 8 includes at least two spaces among the first space, the second space, the third space, and the fourth space. Said at least two spaces included in the communicating portion overlap each other in plan view. The first space to the fourth space may partially overlap each other or may entirely overlap each other.

Note that all of the at least two spaces included in the communicating portion are not required to overlap each other in plan view. For example, when the communicating portion includes the first space to the third space, in plan view, while the first space and the second space overlap each other, the third space does not have to overlap the first second and the second space. Also, for example, when the communicating portion includes the first space to the fourth space, in plan view, while the first space and the second space overlap each other and the third space and the fourth space overlap each other, the first space and the second space do not have to overlap the third space and the fourth space.

According to Preferred Embodiment 8, since two or more spaces among the first space to the fourth space overlap each other and communicate with each other in plan view, the cross-sectional area of the communicating portion can be increased. Since this facilitates circulation of the fluid in the communicating portion, responsiveness of the detecting unit 16d which detects pressure of the fluid can be improved.

In the structure depicted in FIG. 14 and FIG. 15 described as one example of Preferred Embodiment 8, the first space and the third space each singly cause the exposure hole 22a and the outside of the semiconductor device 10G to communicate with each other. However, two or more spaces among the first space to the fourth space may cooperate to cause the exposure hole 22a and the outside of the semiconductor device 10G to communicate with each other.

Figure 16:
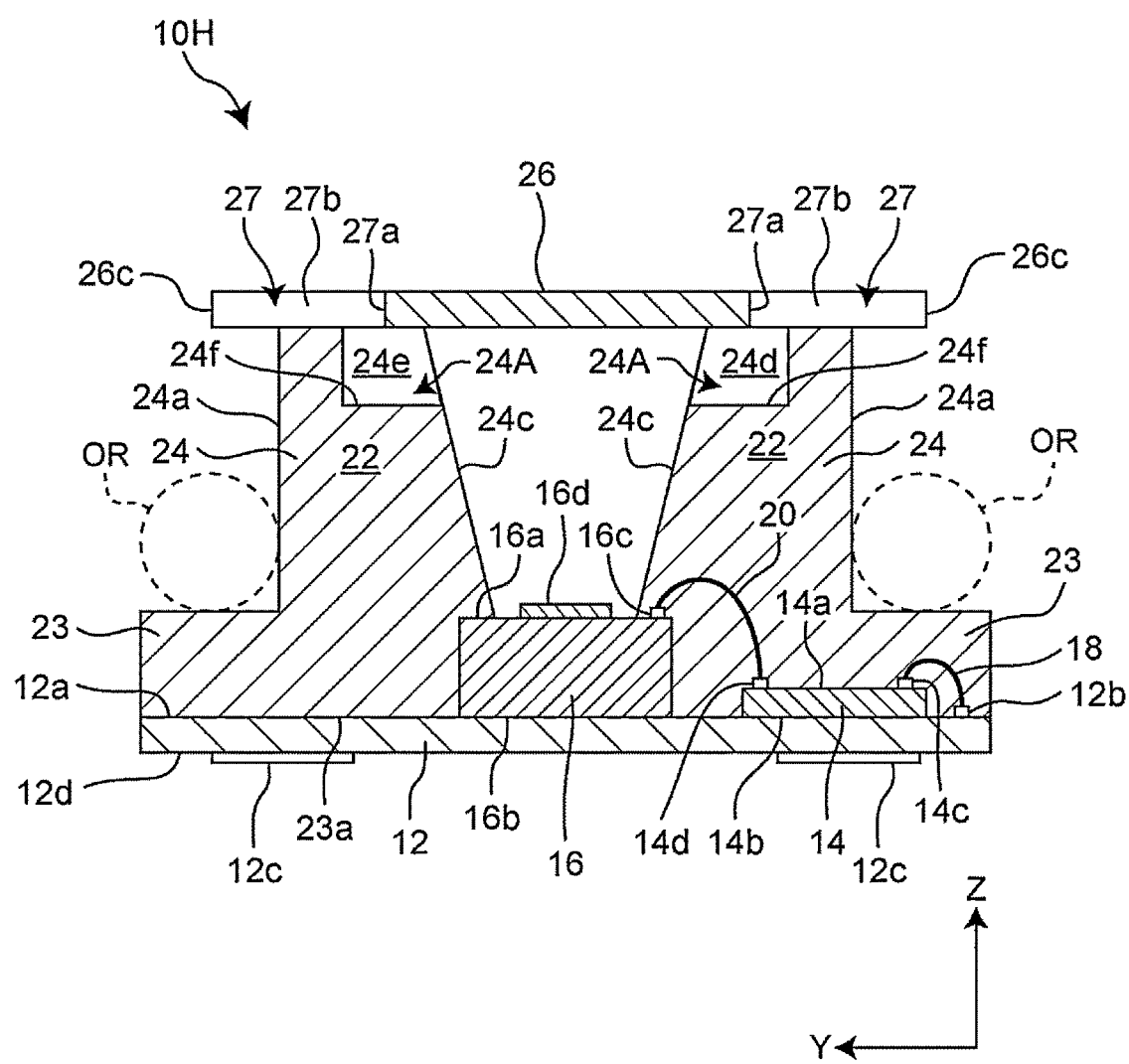
FIG. 16 is a longitudinal sectional view of a modification of the semiconductor device according to Preferred Embodiment 8 of the present invention.

FIG. 16 is a longitudinal sectional view of a modification of the semiconductor device according to Preferred Embodiment 8 of the present invention. For example, in a semiconductor device 10H depicted in FIG. 16, the slit 27 of the lid member 26 communicates with the outside of the semiconductor device 10H but does not communicate with the exposure hole 22a, and the concave portion 24A of the protruding portion 24 of the resin package 22 communicates with the exposure hole 22a but is not open sideward of the semiconductor device 10H. However, in plan view, the slit 27 and the concave portion 24A overlap each other, and thereby the slit 27 and the concave portion 24A communicate with each other. With this, the exposure hole 22a and the outside of the semiconductor device 10H communicate with each other via the concave portion 24A and the slit 27.

Preferred Embodiment 9

Figure 17:
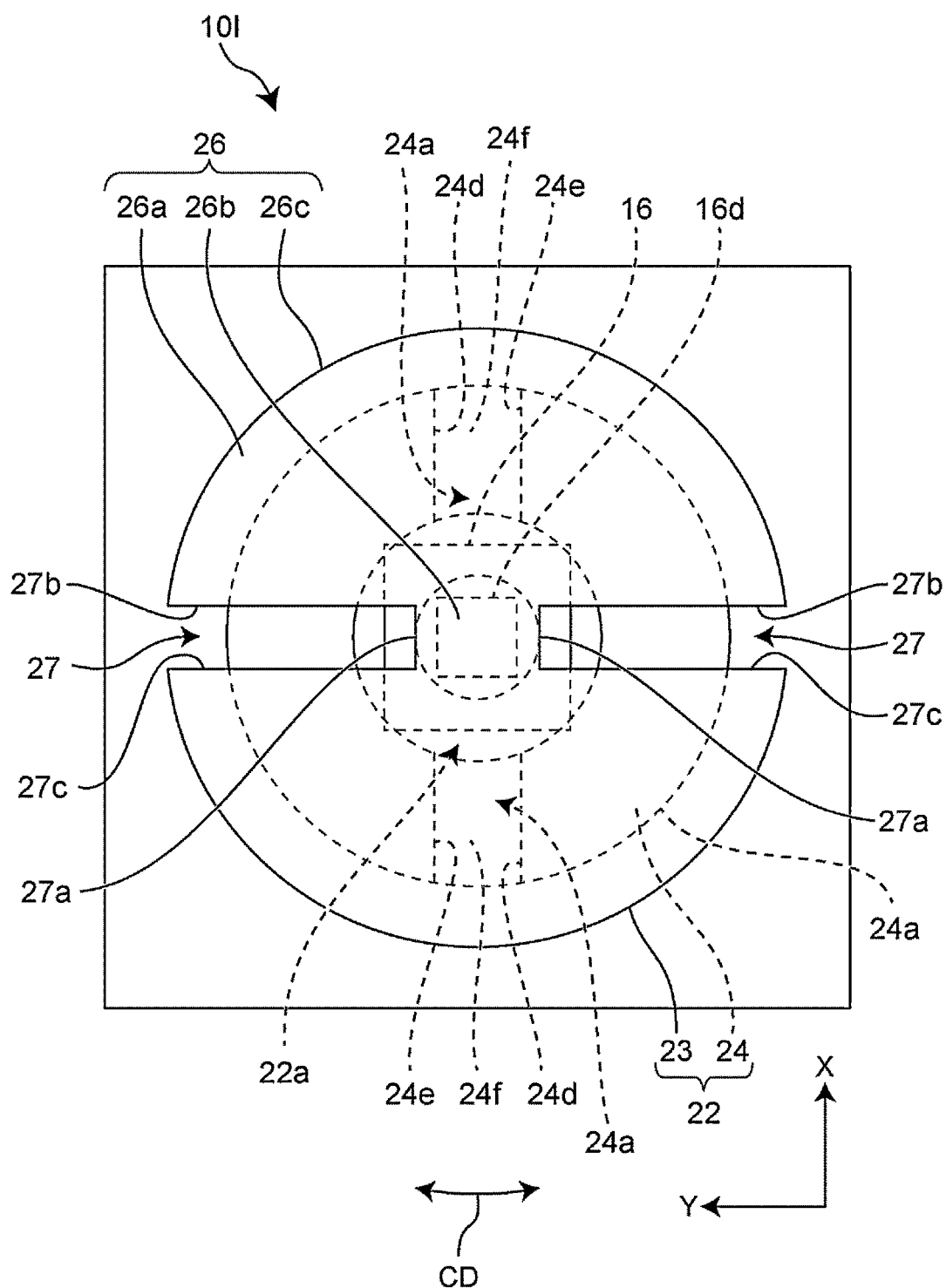
FIG. 17 is a plan view of a semiconductor device according to Preferred Embodiment 9 of the present invention.

FIG. 17 is a plan view of a semiconductor device according to Preferred Embodiment 9 of the present invention. A semiconductor device 10I according to Preferred Embodiment 9 is different from the semiconductor device 10G according to Preferred Embodiment 8 in that the first space and the third space do not overlap each other in plan view.

As depicted in FIG. 17, the lid member 26 of the semiconductor device 10I includes two slits 27, and the protruding portion 24 of the resin package 22 of the semiconductor device 10I includes two concave portions 24A. In this point, the semiconductor device 10I has the same structure as that of the semiconductor device 10G according to Preferred Embodiment 8. However, in the semiconductor device 10I, the two slits 27 and the two concave portions 24A do not overlap each other in plan view. In this point, the semiconductor device 10I is different from the semiconductor device 10G according to Preferred Embodiment 8.

As with the semiconductor device 10G according to Preferred Embodiment 8, the semiconductor device 10I according to Preferred Embodiment 9 is only required to include at least two of the slits 27, the adhering portion 30, the concave portions 24A, and the concave portions 26A. That is, a communicating portion of the semiconductor device 10I according to Preferred Embodiment 9 is only required to include at least two spaces among the first space, the second space, the third space, and the fourth space. In this case, in Preferred Embodiment 9, the at least two spaces included in the communicating portion do not overlap each other in plan view.

According to Preferred Embodiment 9, the number of paths through which the fluid circulates can be increased. Since this facilitates circulation of the fluid in the communicating portion, responsiveness of the detecting unit 16d which detects pressure of the fluid can be improved.

Note that by combining any preferred embodiments among the above-described various preferred embodiments as appropriate, the effects of each preferred embodiment can be achieved. For example, the lid member 26 of the semiconductor device 10B according to Preferred Embodiment 3 may include a plurality of slits 28 (slits 28 each including the wide portion 28A and the narrow portion 28B) of Preferred Embodiment 2, or may include at least one of the slits 27 of Preferred Embodiment 1 and at least one of the slits 28 of Preferred Embodiment 2.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A semiconductor device which detects pressure, the semiconductor device comprising:
   a base substrate;
   a detector mounted on an upper surface of the base substrate and including a pressure detector to detect pressure;
   a resin package provided on the upper surface of the base substrate, with the detector buried therein, and including a cavity which exposes the pressure detector upward;
   a lid supported by the resin package so as to close the cavity; and
   a communicating portion to cause the cavity to communicate with outside of the semiconductor device;
   wherein the resin package includes:
      a base portion where the detector is buried; and
      a protruding portion protruding upward from the base portion and including the cavity;
   in plan view, the base portion extends outward from an outer side surface of the protruding portion;
   the lid is supported by an upper surface of the protruding portion;
   the lid includes an extending portion in at least a portion of an outer circumferential portion of the lid, the extending portion extending outward from the outer side surface of the protruding portion in plan view; and
   the communicating portion is open sideward of the semiconductor device to communicate with outside.

2. The semiconductor device according to claim 1, wherein the communicating portion includes a space defined by a slit located inward of the outer circumferential portion of the lid in plan view.

3. The semiconductor device according to claim 2, wherein the slit is at a position outside of the pressure detector in plan view.

4. The semiconductor device according to claim 2, wherein the slit includes:
   a wide portion at least a portion of which overlaps the cavity in plan view; and
   a narrow portion connected to the wide portion and not overlapping the cavity in plan view.

5. The semiconductor device according to claim 2, wherein the lid includes three or more of the slits.

6. The semiconductor device according to claim 1, further comprising:
   an adhering portion interposed partially between the upper surface of the protruding portion and the lid to fix the lid to the protruding portion; wherein
   the communicating portion includes a space between the upper surface of the protruding portion and the lid which are opposed to each other in a portion between the upper surface of the protruding portion and the lid where the adhering portion is not interposed.

7. The semiconductor device according to claim 1, wherein
   the protruding portion includes a first concave portion recessed downward from the upper surface of the protruding portion; and
   the communicating portion includes a space defined by the first concave portion.

8. The semiconductor device according to claim 1, wherein
   the lid includes a second concave portion recessed upward from a lower surface of the lid; and
   the communicating portion includes a space defined by the second concave portion.

9. The semiconductor device according to claim 1, further comprising:
- at least two of a slit located inward of the outer circumferential portion of the lid in plan view, an adhering portion interposed partially between the upper surface of the protruding portion and the lid to fix the lid to the protruding portion, a first concave portion recessed downward from the upper surface of the protruding portion, and a second concave portion recessed upward from a lower surface of the lid; wherein
- when the semiconductor device includes the slit, the communicating portion includes a first space defined by the slit;
- when the semiconductor device includes the adhering portion, the communicating portion includes a second space between the upper surface of the protruding portion and the lid which are opposed to each other in a portion between the upper surface of the protruding portion and the lid where the adhering portion is not provided;
- when the semiconductor device includes the first concave portion, the communicating portion includes a third space defined by the first concave portion;
- when the semiconductor device includes the second concave portion, the communicating portion includes a fourth space defined by the second concave portion; and
- in plan view, the first space, the second space, the third space, and the fourth space overlap one another.

10. The semiconductor device according to claim 1, further comprising:
- at least two of a slit located inward of the outer circumferential portion of the lid in plan view, an adhering portion interposed partially between the upper surface of the protruding portion and the lid to fix the lid to the protruding portion, a first concave portion recessed downward from the upper surface of the protruding portion, and a second concave portion recessed upward from a lower surface of the lid; wherein
- when the semiconductor device includes the slit, the communicating portion includes a first space defined by the slit;
- when the semiconductor device includes the adhering portion, the communicating portion includes a second space between the upper surface of the protruding portion and the lid which are opposed to each other in a portion between the upper surface of the protruding portion and the lid where the adhering portion is not provided;
- when the semiconductor device includes the first concave portion, the communicating portion includes a third space defined by the first concave portion;
- when the semiconductor device includes the second concave portion, the communicating portion includes a fourth space defined by the second concave portion; and
- in plan view, the first space, the second space, the third space, and the fourth space do not overlap one another.

11. The semiconductor device according to claim 1, further comprising:
- a circuit element mounted on the upper surface of the base substrate; and
- a connector electrically connecting the circuit element and the detector together.

12. An electronic apparatus comprising:
- the semiconductor device according to claim 1;
- an O ring surrounding the protruding portion of the resin package of the semiconductor device in plan view and including an inner circumferential portion in contact with the outer side surface of the protruding portion; and
- a casing to which the semiconductor device is attached.

13. The electronic apparatus according to claim 12, wherein the communicating portion includes a space defined by a slit located inward of the outer circumferential portion of the lid in plan view.

14. The electronic apparatus according to claim 13, wherein the slit is at a position outside of the pressure detector in plan view.

15. The electronic apparatus according to claim 13, wherein the slit includes:
- a wide portion at least a portion of which overlaps the cavity in plan view; and
- a narrow portion connected to the wide portion and not overlapping the cavity in plan view.

16. The electronic apparatus according to claim 13, wherein the lid includes three or more of the slits.

17. The electronic apparatus according to claim 12, further comprising:
- an adhering portion interposed partially between the upper surface of the protruding portion and the lid to fix the lid to the protruding portion; wherein
- the communicating portion includes a space between the upper surface of the protruding portion and the lid which are opposed to each other in a portion between the upper surface of the protruding portion and the lid where the adhering portion is not interposed.

18. The electronic apparatus according to claim 12, wherein
- the protruding portion includes a first concave portion recessed downward from the upper surface of the protruding portion; and
- the communicating portion includes a space defined by the first concave portion.

19. The electronic apparatus according to claim 12, wherein
- the lid includes a second concave portion recessed upward from a lower surface of the lid; and
- the communicating portion includes a space defined by the second concave portion.

20. The electronic apparatus according to claim 12, further comprising:
- a circuit element mounted on the upper surface of the base substrate; and
- a connector electrically connecting the circuit element and the detector together.

* * * * *